(12) United States Patent
Jang

(10) Patent No.: US 12,622,103 B2
(45) Date of Patent: May 5, 2026

(54) DISPLAY DEVICE AND METHOD OF MANUFACTURING THE DISPLAY DEVICE

(71) Applicant: Samsung Display Co., LTD., Yongin-si (KR)

(72) Inventor: Joo Nyung Jang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 364 days.

(21) Appl. No.: 18/333,704

(22) Filed: Jun. 13, 2023

(65) Prior Publication Data

US 2024/0162386 A1 May 16, 2024

(30) Foreign Application Priority Data

Nov. 16, 2022 (KR) ........................ 10-2022-0153900

(51) Int. Cl.
| | |
|---|---|
| *H01L 33/38* | (2010.01) |
| *H01L 25/075* | (2006.01) |
| *H01L 33/24* | (2010.01) |
| *H01L 33/62* | (2010.01) |
| *H10H 20/821* | (2025.01) |
| *H10H 20/831* | (2025.01) |
| *H10H 20/857* | (2025.01) |
| *H10H 20/01* | (2025.01) |

(52) U.S. Cl.
CPC ....... *H10H 20/831* (2025.01); *H01L 25/0753* (2013.01); *H10H 20/821* (2025.01); *H10H 20/857* (2025.01); *H10H 20/032* (2025.01)

(58) Field of Classification Search
CPC .. H10H 20/831; H10H 20/821; H10H 20/857; H01L 25/0753
See application file for complete search history.

(56) References Cited

U.S. PATENT DOCUMENTS

| | | | | |
|---|---|---|---|---|
| 7,038,315 B2 * | 5/2006 | King | .................. | H01L 23/4951 |
| | | | | 257/737 |
| 2019/0326348 A1 * | 10/2019 | Im | ........................... | G09G 3/32 |

(Continued)

FOREIGN PATENT DOCUMENTS

| | | |
|---|---|---|
| KR | 10-2020-0014868 | 2/2020 |
| KR | 10-2020-0017013 | 2/2020 |

(Continued)

OTHER PUBLICATIONS

Li et al., KR20200017013_machine translation (Year: 2020).*
Yang , KR 10-2020-0129244, machine translation, Nov. 2020 (Year: 2020).*

*Primary Examiner* — Tracie Y Green
(74) *Attorney, Agent, or Firm* — Womble Bond Dickinson (US) LLP

(57) ABSTRACT

A display device includes pixels in a display area, a first alignment electrode and a second alignment electrode that are spaced apart from each other in the pixels and extend in a first direction, a first auxiliary electrode and a second auxiliary electrode that cross the pixels and extend in a second direction intersecting the first direction, and light emitting elements that are disposed between the first alignment electrode and the second alignment electrode. A first end of the light emitting elements faces the first alignment electrode, and a second end of the light emitting elements faces the second alignment electrode.

20 Claims, 16 Drawing Sheets

(56)  References Cited

U.S. PATENT DOCUMENTS

| | | | | |
|---|---|---|---|---|
| 2020/0343426 A1* | 10/2020 | Rhee | .................. | H10H 20/8512 |
| 2020/0365648 A1* | 11/2020 | Jang | .................... | H10H 20/853 |
| 2021/0273131 A1 | 9/2021 | Kang et al. | | |
| 2021/0296550 A1 | 9/2021 | Li et al. | | |
| 2022/0037299 A1 | 2/2022 | Lee et al. | | |
| 2022/0173160 A1 | 6/2022 | Pak et al. | | |
| 2022/0406972 A1 | 12/2022 | Im et al. | | |
| 2023/0049446 A1* | 2/2023 | Kim | .................... | H10H 20/857 |
| 2023/0135290 A1 | 5/2023 | Choi et al. | | |

FOREIGN PATENT DOCUMENTS

| | | |
|---|---|---|
| KR | 10-2020-0021485 | 2/2020 |
| KR | 10-2020-0034898 | 4/2020 |
| KR | 10-2020-0034906 | 4/2020 |
| KR | 10-2021-0059088 | 5/2021 |
| KR | 10-2022-0075585 | 6/2022 |

* cited by examiner

PXL

SE1

LDa

EP1

EP2

AE1

AE2

EP2

EP1

LDb

SE2

DR1

DR3  DR2

AE: AE1, AE2
SE: SE1, SE2
LD: LDa, LDb

FIG. 13

PXL

SE1

LDa

EP1

EP2

AE1

AE2

EP1

EP2

LDb

SE2

DR1

DR3 → DR2

AE: AE1, AE2
SE: SE1, SE2
LD: LDa, LDb

AE: AE1, AE2
SE: SE1, SE2
LD: LDa, LDb

FIG. 17

DISPLAY DEVICE AND METHOD OF MANUFACTURING THE DISPLAY DEVICE

CROSS-REFERENCE TO RELATED APPLICATION(S)

This application claims priority to and benefits of Korean Patent Application No. 10-2022-0153900 under 35 U.S.C. § 119, filed on Nov. 16, 2022 in the Korean Intellectual Property Office, the entire contents of which are incorporated herein by reference.

BACKGROUND

1. Technical Field

The disclosure relates to a display device and a method of manufacturing the display device.

2. Description of the Related Art

Recently, as interest in information display is increasing, research and development for a display device is continuously being conducted.

SUMMARY

An aspect to be solved by the disclosure is to provide a display device and a method of manufacturing the display device capable of improving an alignment degree of light emitting elements.

Aspects of the disclosure are not limited to the above-described aspect, and other technical aspects which are not described will be clearly understood by those skilled in the art from the following description.

According to an embodiment, a display device may include pixels in a display area, a first alignment electrode and a second alignment electrode that are spaced apart from each other in the pixels and extend in a first direction, a first auxiliary electrode and a second auxiliary electrode that cross the pixels and extend in a second direction intersecting the first direction, and light emitting elements disposed between the first alignment electrode and the second alignment electrode. A first end of the light emitting elements may face the first alignment electrode, and a second end of the light emitting elements may face the second alignment electrode.

The display device may further include an auxiliary line that extends in the first direction in a non-display area surrounding the display area.

The first auxiliary electrode and the second auxiliary electrode may be electrically connected to the auxiliary line.

The display device may further include an alignment line that extends in the second direction between the pixels.

The first alignment electrode and the second alignment electrode may be electrically connected to the alignment line.

The first alignment electrode and the second alignment electrode may be alternately disposed in the second direction.

The first auxiliary electrode and the second auxiliary electrode may be alternately disposed in the first direction.

A distance between the first alignment electrode and the second alignment electrode may be less than a distance between the first auxiliary electrode and the second auxiliary electrode.

The display device may further include an insulating layer disposed between the first auxiliary electrode and the second auxiliary electrode and the first alignment electrode and the second alignment electrode.

The display device may further include connection electrodes disposed on the light emitting elements.

According to an embodiment, a method of manufacturing a display device may include providing a first alignment electrode and a second alignment electrode that are spaced apart from each other in pixels provided in a display area, firstly aligning light emitting elements in a first alignment direction between the first alignment electrode and the second alignment electrode, providing a first auxiliary electrode and a second auxiliary electrode that extend across the pixels, secondly aligning the light emitting elements in a second alignment direction intersecting the first alignment direction between the first auxiliary electrode and the second auxiliary electrode, and thirdly aligning the light emitting elements in the first alignment direction so that a first end of the light emitting elements faces the first alignment electrode and a second end of the light emitting elements faces the second alignment electrode.

The first alignment electrode and the second alignment electrode may extend in a first direction.

The first alignment direction may be perpendicular to the first direction.

The first auxiliary electrode and the second auxiliary electrode may extend in a second direction perpendicular to the first direction.

The second direction may be perpendicular to the second alignment direction.

The first auxiliary electrode and the second auxiliary electrode may extend in a second direction inclined with respect to the first direction.

The second direction may be perpendicular to the second alignment direction.

The method may further include forming an auxiliary line that extends in the first direction in a non-display area surrounding the display area and may be electrically connected to the first auxiliary electrode and the second auxiliary electrode.

A distance between the first alignment electrode and the second alignment electrode may be less than a distance between the first auxiliary electrode and the second auxiliary electrode.

The method may further include forming connection electrodes on the thirdly aligned light emitting elements.

Details of other embodiments are included in the detailed description and drawings.

According to embodiments, light emitting elements may be biasedly aligned by precisely controlling a position and a direction of the light emitting elements using alignment electrodes and auxiliary electrodes.

An effect according to embodiments is not limited by the contents illustrated above, and various additional effects are included in the specification.

BRIEF DESCRIPTION OF THE DRAWINGS

The above and other features of the disclosure will become more apparent by describing in further detail embodiments thereof with reference to the accompanying drawings, in which:

FIGS. 10 to 13 are schematic plan views for each process step of a method of manufacturing a display device according to an embodiment; and FIGS. 14 to 17 are schematic plan views for each process step of a method of manufacturing a display device according to an embodiment.

DETAILED DESCRIPTION OF THE EMBODIMENTS

Figure 1:
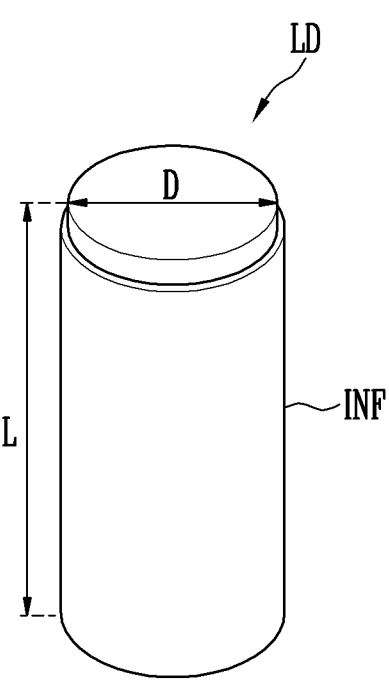
FIG. 1 is a schematic perspective view illustrating a light emitting element according to an embodiment.

The advantages and features of the disclosure and a method of achieving them will become apparent with reference to the embodiments described in detail below together with the accompanying drawings. However, the disclosure is not limited to the embodiments disclosed below, and may be implemented in various different forms. The embodiments are provided so that the disclosure will be thorough and complete and those skilled in the art to which the disclosure pertains can fully understand the scope of the disclosure.

The terms used in the specification are for describing embodiments and are not intended to limit the disclosure. In the specification, the singular form also includes the plural form unless otherwise specified. The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The term "coupling" or "connection" may collectively mean a physical and/or electrical coupling or connection. This may collectively mean a direct or indirect coupling or connection and an integral or non-integral coupling or connection.

A case in which an element or a layer is referred to as "on" another element or layer may include a case in which another layer or another element is disposed directly on the other element or between the other layers. The same reference numerals denote the same components throughout the specification.

Although the terms "first," "second," and the like are used to describe various components, these components are not limited by these terms. These terms are used only to distinguish one component from another component. Therefore, a first component described below may be a second component within the technical spirit of the disclosure.

The terms "face" and "facing" mean that a first element may directly or indirectly oppose a second element. In a case in which a third element intervenes between the first and second element, the first and second element may be understood as being indirectly opposed to one another, although still facing each other.

In the specification and the claims, the term "and/or" is intended to include any combination of the terms "and" and "or" for the purpose of its meaning and interpretation. For example, "A and/or B" may be understood to mean any combination including "A, B, or A and B." The terms "and"

and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean any combination including "A, B, or A and B."

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
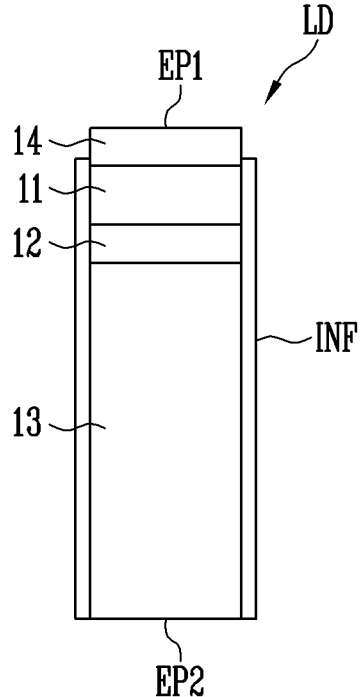
FIG. 2 is a schematic cross-sectional view illustrating a light emitting element according to an embodiment.

FIG. 1 is a schematic perspective view illustrating a light emitting element according to an embodiment. FIG. 2 is a schematic cross-sectional view illustrating a light emitting element according to an embodiment. FIGS. 1 and 2 show a column shape light emitting element LD, but a type and/or a shape of the light emitting element LD is/are not limited thereto.

Referring to FIGS. 1 and 2, the light emitting element LD may include a first semiconductor layer 11, an active layer 12, a second semiconductor layer 13, and/or an electrode layer 14.

The light emitting element LD may be formed in a column shape extending along a direction. The light emitting element LD may have a first end EP1 and a second end EP2. One of the first and second semiconductor layers 11 and 13 may be disposed at the first end EP1 of the light emitting element LD. The other of the first and second semiconductor layers 11 and 13 may be disposed at the second end EP2 of the light emitting element LD. For example, the first semiconductor layer 11 may be disposed at the first end EP1 of the light emitting element LD, and the second semiconductor layer 13 may be disposed at the second end EP2 of the light emitting element LD.

According to an embodiment, the light emitting element LD may be a light emitting element manufactured in a column shape through an etching method or the like. In the specification, the column shape includes a rod-like shape or a bar-like shape of which an aspect ratio is greater than 1, such as a circular column or a polygonal column, and the shape of the cross-section thereof is not limited.

The light emitting element LD may have a size as small as a nanometer scale to a micrometer scale. For example, each light emitting element LD may have a diameter D (or width) and/or a length L of a nanometer scale to micrometer scale range. However, a size of the light emitting element LD is not limited thereto, and the size of the light emitting element LD may be variously changed according to a design condition of various devices using a light emitting device using the light emitting element LD as a light source, for example, a display device or the like.

The first semiconductor layer 11 may be a semiconductor layer of a first conductivity type. For example, the first semiconductor layer 11 may include a p-type semiconductor layer. For example, the first semiconductor layer 11 may include at least one semiconductor material among InAl-GaN, GaN, AlGaN, InGaN, and AlN, and may include a p-type semiconductor layer doped with a first conductivity type dopant such as Mg. However, a material configuring the first semiconductor layer 11 is not limited thereto, and various other materials may configure the first semiconductor layer 11.

The active layer 12 may be disposed between the first semiconductor layer 11 and the second semiconductor layer 13. The active layer 12 may include at least one of a single well structure, a multi well structure, a single quantum well structure, a multi quantum well (MQW) structure, a quantum dot structure, or a quantum wire structure, but is not limited thereto. The active layer 12 may include GaN, InGaN, InAlGaN, AlGaN, and/or AlN, and various other materials may configure the active layer 12.

In case that a voltage equal to or greater than a threshold voltage is applied to both ends of the light emitting element LD, an electron-hole pair may be combined in the active layer 12 and thus the light emitting element LD emits light. By controlling emission of the light emitting element LD using such a principle, the light emitting element LD may be used as a light source of various light emitting devices including a pixel of a display device.

The second semiconductor layer 13 may be disposed on the active layer 12 and may include a semiconductor layer of a type different from that of the first semiconductor layer 11. The second semiconductor layer 13 may include an n-type semiconductor layer. For example, the second semiconductor layer 13 may include at least one semiconductor material among InAlGaN, GaN, AlGaN, InGaN, and AlN, and may include an n-type semiconductor layer doped with a second conductivity type dopant such as Si, Ge, and/or Sn. However, a material configuring the second semiconductor layer 13 is not limited thereto, and various other materials may configure the second semiconductor layer 13.

The electrode layer 14 may be disposed on the first end EP1 and/or the second end EP2 of the light emitting element LD. FIG. 2 illustrates a case in which the electrode layer 14 is formed on the first semiconductor layer 11, but the disclosure is not limited thereto. For example, a separate contact electrode may be further disposed on the second semiconductor layer 13.

The electrode layer 14 may include a transparent metal or a transparent metal oxide. For example, the electrode layer 14 may include at least one of indium tin oxide (ITO), indium zinc oxide (IZO), and zinc tin oxide (ZTO), but is not limited thereto. As described above, in case that the electrode layer 14 is formed of the transparent metal or the transparent metal oxide, light generated in the active layer 12 of the light emitting element LD may pass through the electrode layer 14 and may be emitted outside of the light emitting element LD.

An insulating film INF may be provided on a surface of the light emitting element LD. The insulating film INF may be directly disposed on a surface of the first semiconductor layer 11, the active layer 12, the second semiconductor layer 13, and/or the electrode layer 14. The insulating film INF may expose the first and second ends EP1 and EP2 of the light emitting element LD having different polarities. According to an embodiment, the insulating film INF may expose a side portion of the electrode layer 14 and/or the second semiconductor layer 13 adjacent to the first and second ends EP1 and EP2 of the light emitting element LD.

The insulating film INF may prevent an electrical short that may occur in case that the active layer 12 comes into contact with a conductive material except for the first and second semiconductor layers 11 and 13. The insulating film INF may minimize a surface defect of the light emitting elements LD, thereby improving lifespan and emission efficiency of the light emitting elements LD.

The insulating film INF may include at least one of silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), and titanium oxide (TiOx). For example, the insulating film INF may be configured as double layers, and each layer configuring the double layers may include different materials. For example, the insulating film INF may be configured as double layers configured of aluminum oxide (AlOx) and silicon oxide (SiOx), but is not limited thereto. According to an embodiment, the insulating film INF may be omitted.

A light emitting device including the light emitting element LD described above may be used in various types of devices that require a light source, including a display device. For example, the light emitting elements LD may be disposed in each pixel of a display panel, and the light emitting elements LD may be used as a light source of each pixel. However, an application field of the light emitting element LD is not limited to the above-described example. For example, the light emitting element LD may also be used in other types of devices that require a light source, such as a lighting device.

Figure 3:
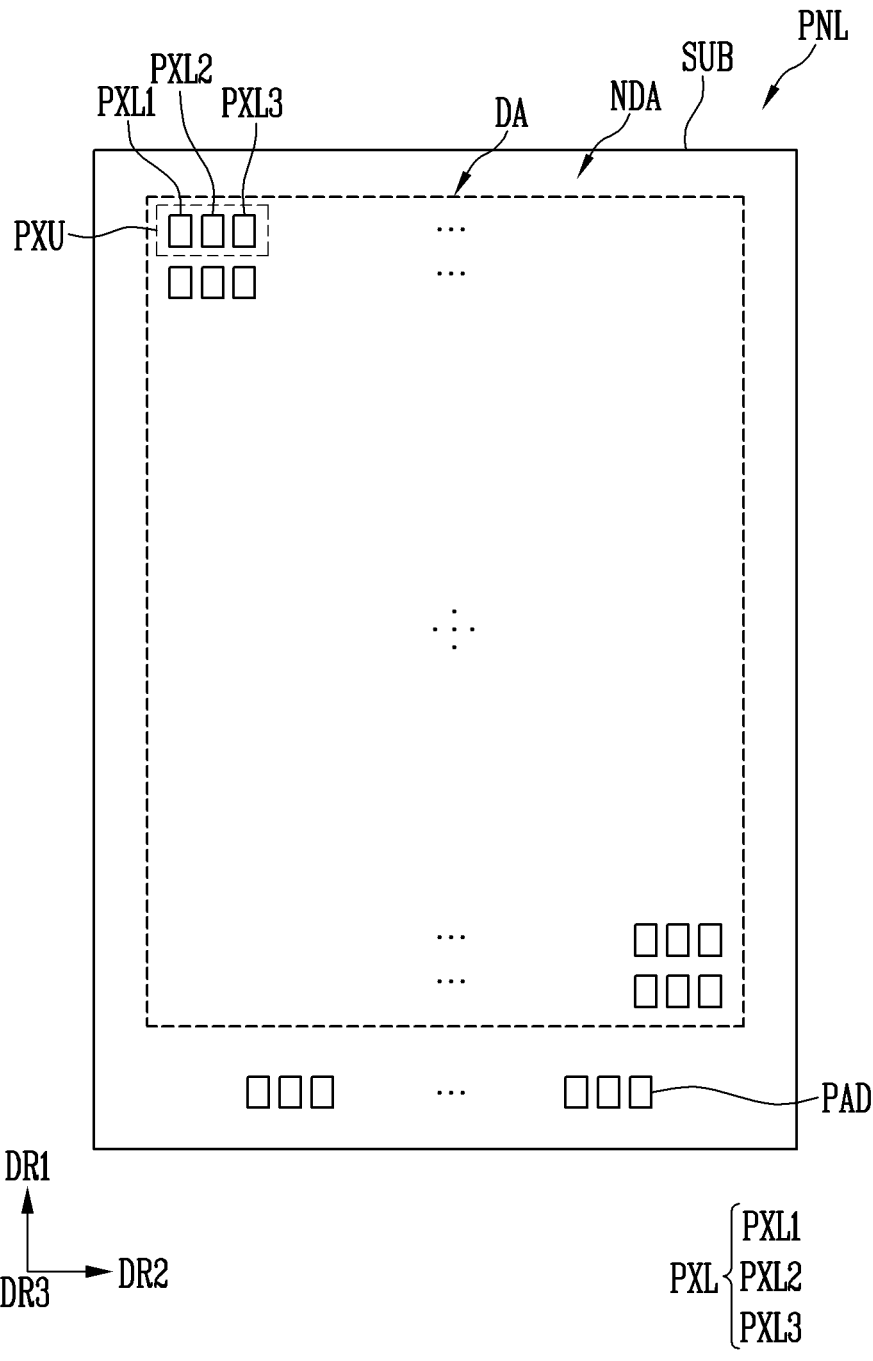
FIG. 3 is a schematic plan view illustrating a display device according to an embodiment.

FIG. 3 is a schematic plan view illustrating a display device according to an embodiment.

In FIG. 3, as an example of an electronic device that may use the light emitting element LD described in the embodiments of FIGS. 1 and 2 as a light source, a display device, particularly, a display panel PNL provided in the display device is shown.

For convenience of description, a structure of the display panel PNL is shown based on a display area DA in FIG. 3. However, according to an embodiment, at least one driving circuit unit (for example, at least one of a scan driver and a data driver) and lines which are not shown may be further disposed on the display panel PNL.

Referring to FIG. 3, the display panel PNL and a substrate SUB for forming the same may include the display area DA for displaying an image and a non-display area NDA except for the display area DA. The display area DA may configure a screen on which the image is displayed, and the non-display area NDA may be an area except for the display area DA.

A pixel unit PXU may be disposed in the display area DA. The pixel unit PXU may include a first pixel PXL1, a second pixel PXL2, and/or a third pixel PXL3. Hereinafter, when at least one pixel among the first pixel PXL1, the second pixel PXL2, and the third pixel PXL3 is arbitrarily referred to, or when two or more types of pixels are collectively referred to, the at least one pixel or the two or more types of pixels are referred to as a "pixel PXL" or "pixels PXL".

The pixels PXL may be regularly arranged according to a stripe or PENTILE™ arrangement structure, or the like. However, an arrangement structure of the pixels PXL is not limited thereto, and the pixels PXL may be arranged in the display area DA in various structures and/or methods.

According to an embodiment, two or more types of pixels PXL emitting light of different colors may be disposed in the display area DA. For example, in the display area DA, the first pixels PXL1 emitting light of a first color, the second pixels PXL2 emitting light of a second color, and the third pixels PXL3 emitting light of a third color may be arranged. At least one of the first to third pixels PXL1, PXL2, and PXL3 disposed to be adjacent to each other may configure a pixel unit PXU capable of emitting light of various colors. For example, each of the first to third pixels PXL1, PXL2, and PXL3 may be a pixel emitting light of a predetermined or selected color. According to an embodiment, the first pixel PXL1 may be a red pixel emitting red light, the second pixel PXL2 may be a green pixel emitting green light, and the third pixel PXL3 may be a blue pixel emitting blue light, but are not limited thereto.

In an embodiment, the first pixel PXL1, the second pixel PXL2, and the third pixel PXL3 may include light emitting elements that emit light of the same color, and may include a color conversion layer and/or a color filter layer of different colors disposed on the respective light emitting elements, to emit light of the first color, the second color, and the third color, respectively. In another embodiment, the first pixel PXL1, the second pixel PXL2, and the third pixel PXL3 may include a light emitting element of the first color, a light emitting element of the second color, and a light emitting element of the third color as a light source, to emit light of the first color, the second color, and the third color, respectively. However, the color, type, number, and/or the like of the pixels PXL configuring each pixel unit PXU is/are not particularly limited. For example, the color of light emitted by each pixel PXL may be variously changed.

The pixel PXL may include at least one light source driven by a predetermined or selected control signal (for example, a scan signal and a data signal) and/or predetermined or selected power (for example, first power and second power). In an embodiment, the light source may include at least one light emitting element LD according to any of the embodiments of FIGS. 1 and 2, for example, an ultra-small column shape light emitting elements LD having a size as small as a nanometer scale to a micrometer scale. However, the disclosure is not limited thereto, and various types of light emitting elements LD may be used as the light source of the pixel PXL.

In an embodiment, each pixel PXL may be configured as an active pixel. However, a type, a structure, and/or a driving method of the pixel PXL applicable to the display device is/are not particularly limited. For example, each pixel PXL may be configured as a pixel of a passive or active light emitting display device of various structures and/or driving methods.

The non-display area NDA may be disposed around the display area DA. A pad PAD may be disposed in the non-display area NDA. The pad PAD may be electrically connected to at least one driving circuit unit. The pixel PXL may be electrically connected to the pad PAD through a fan-out line to receive a driving signal from the driving circuit unit. In FIG. 3, the pad PAD is disposed only below the display panel PNL, but the disclosure is not limited thereto. For example, each pad PAD may be disposed above and below the display panel PNL.

FIGS. 4 to 7 are schematic plan views illustrating a pixel according to an embodiment. FIG. 8 is a schematic cross-sectional view taken along line A-A' of FIG. 4.

Figure 5:
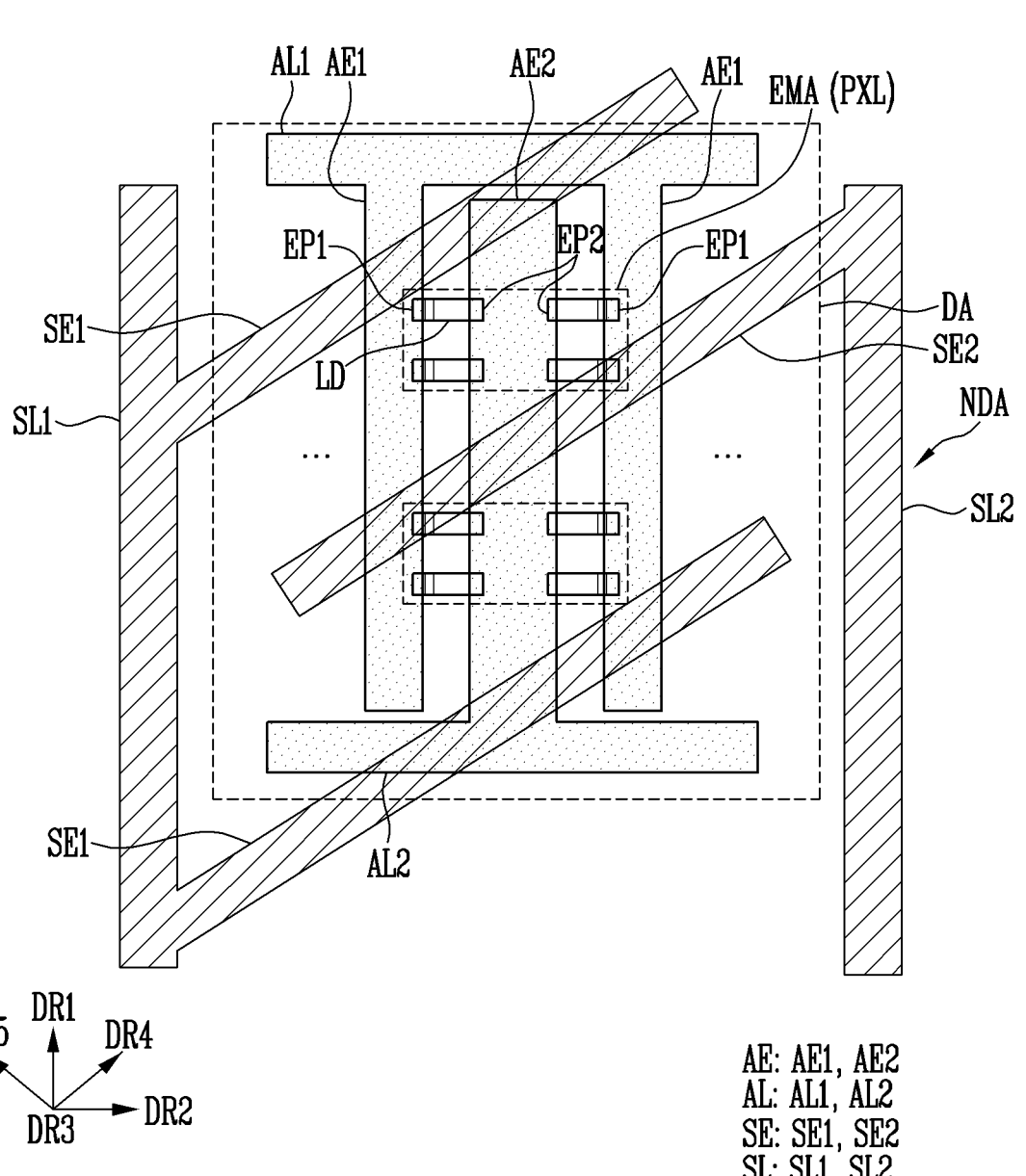
Figure 6:
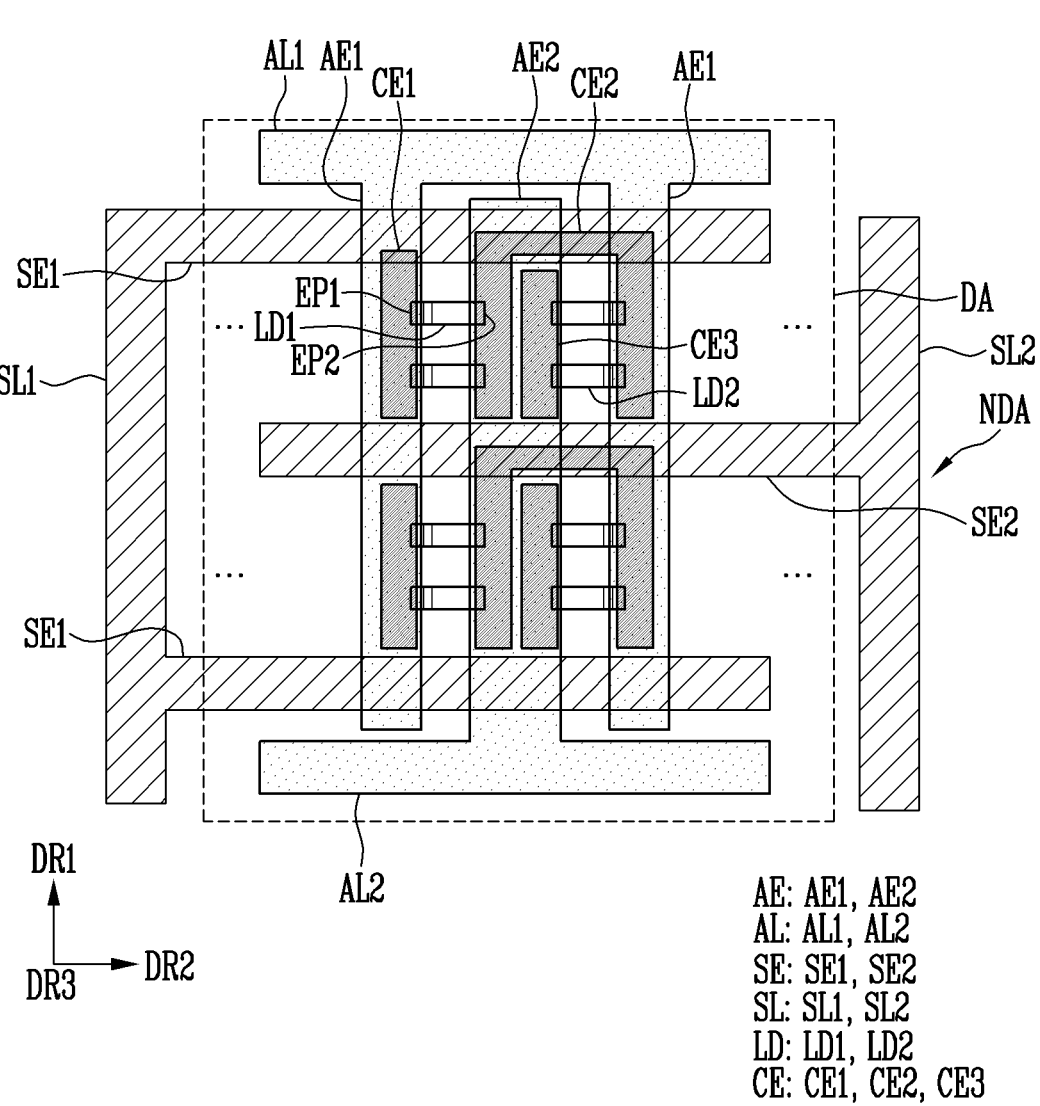
Figure 7:
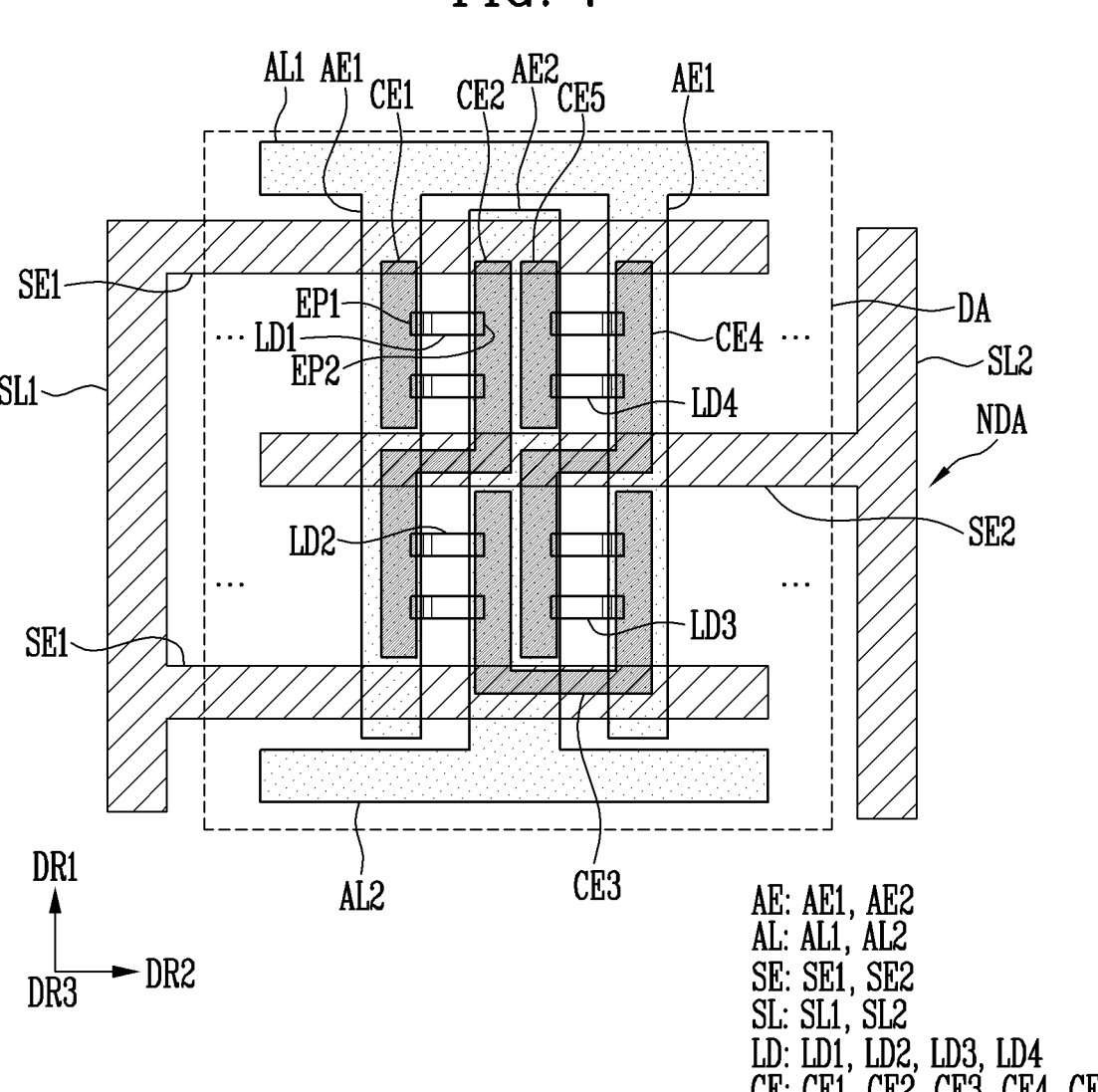
Figure 8:
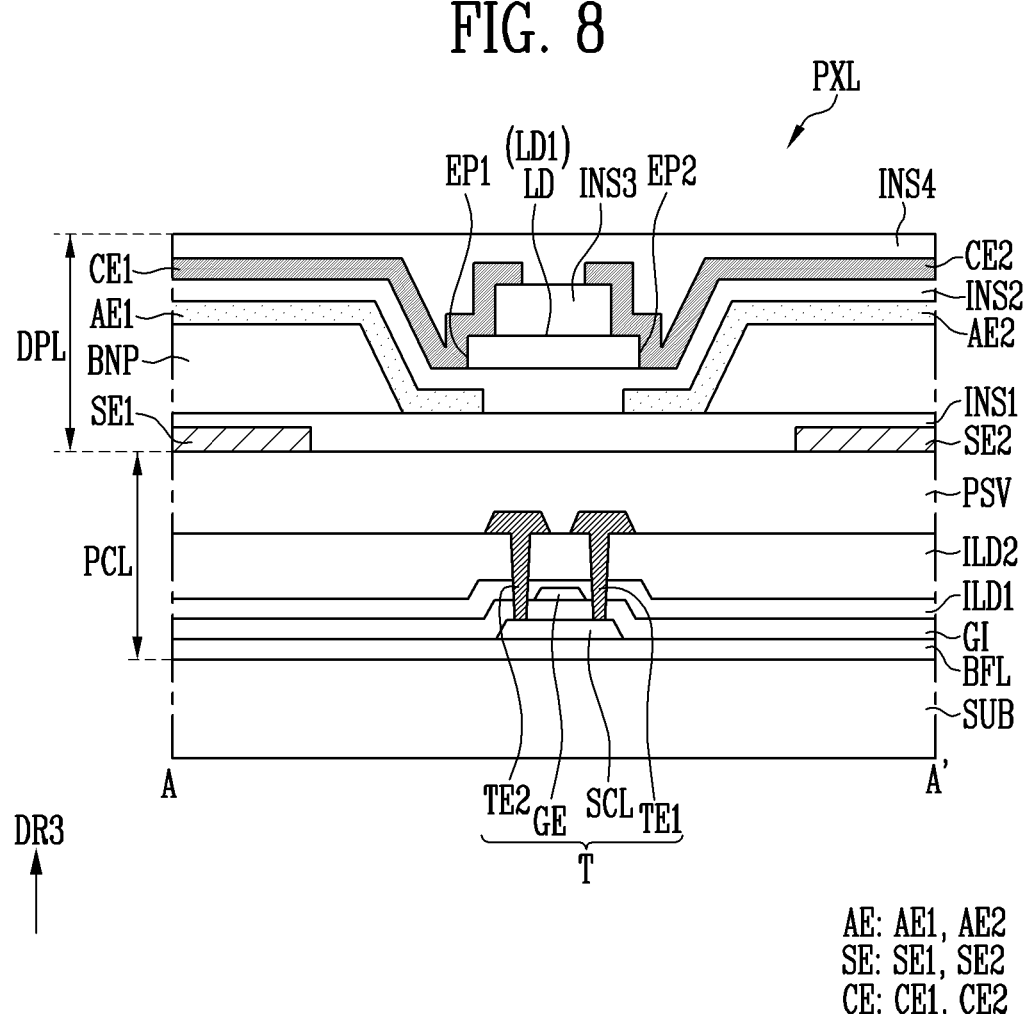
FIG. 8 is a schematic cross-sectional view taken along line A-A' of FIG. 4.

The pixel PXL shown in FIGS. 4 to 8 may be any of the first pixel PXL1, the second pixel PXL2, and the third pixel PXL3 provided in the display panel PNL of FIG. 3. The first pixel PXL1, the second pixel PXL2, and the third pixel PXL3 may have structures identical or similar to each other. FIG. 7 shows an embodiment in which the pixel PXL includes light emitting elements LD disposed in two series stages, and FIG. 8 shows an embodiment in which the pixel PXL includes light emitting elements LD disposed in four series stages, but the number of series stages of each pixel PXL may be variously changed according to an embodiment.

Referring to FIGS. 4 to 7, each pixel PXL may include an emission area EMA. The emission area EMA may include the light emitting elements LD and may be an area capable of emitting light.

The pixel PXL may include alignment electrodes AE, auxiliary electrodes SE, the light emitting elements LD, and/or connection electrodes CE.

The alignment electrodes AE may be provided at least in the emission area EMA. The alignment electrodes AE may extend in a first direction DR1 and may be spaced apart from each other in a second direction DR2.

Each of first and second alignment electrodes AE1 and AE2 may extend in the first direction DR1 and may be alternately disposed in the second direction DR2 crossing the first direction DR1. For example, the first direction DR1 may be a Y-axis direction, the second direction DR2 may be an X-axis direction, and a third direction DR3 may be a Z-axis direction, but the disclosure is not necessarily limited thereto. Some of the alignment electrodes AE may be connected to a pixel circuit and/or a predetermined or selected power line through a contact hole, but the disclosure is not necessarily limited thereto.

The alignment electrodes AE may receive an alignment signal in a step of aligning the light emitting elements LD. Accordingly, the light emitting elements LD may be arranged in a direction (for example, in the second direction DR2) between the alignment electrodes AE. A pair of alignment electrodes AE adjacent to each other may receive different signals during the alignment step of the light emitting elements LD. For example, in case that the first and second alignment electrodes AE1 and AE2 are alternately arranged, the first alignment electrode AE1 and the second alignment electrode AE2 may receive different alignment signals. The step of aligning the light emitting elements LD using the alignment electrodes AE is described later with reference to FIGS. 11, 13, 15, 17, and the like.

The alignment electrodes AE may be electrically connected to alignment lines AL. The alignment lines AL may provide an alignment signal to the alignment electrodes AE. A first alignment line AL1 may be electrically connected to the first alignment electrode AE1, and a second alignment line AL2 may be electrically connected to the second alignment electrode AE2.

The alignment lines AL may be disposed around the emission area EMA. For example, the alignment lines AL may be disposed in the display area DA and disposed between the emission area EMA (or the pixels PXL). The alignment lines AL may extend in the second direction DR2 and may be spaced apart from each other in the first direction DR1.

Figure 4:
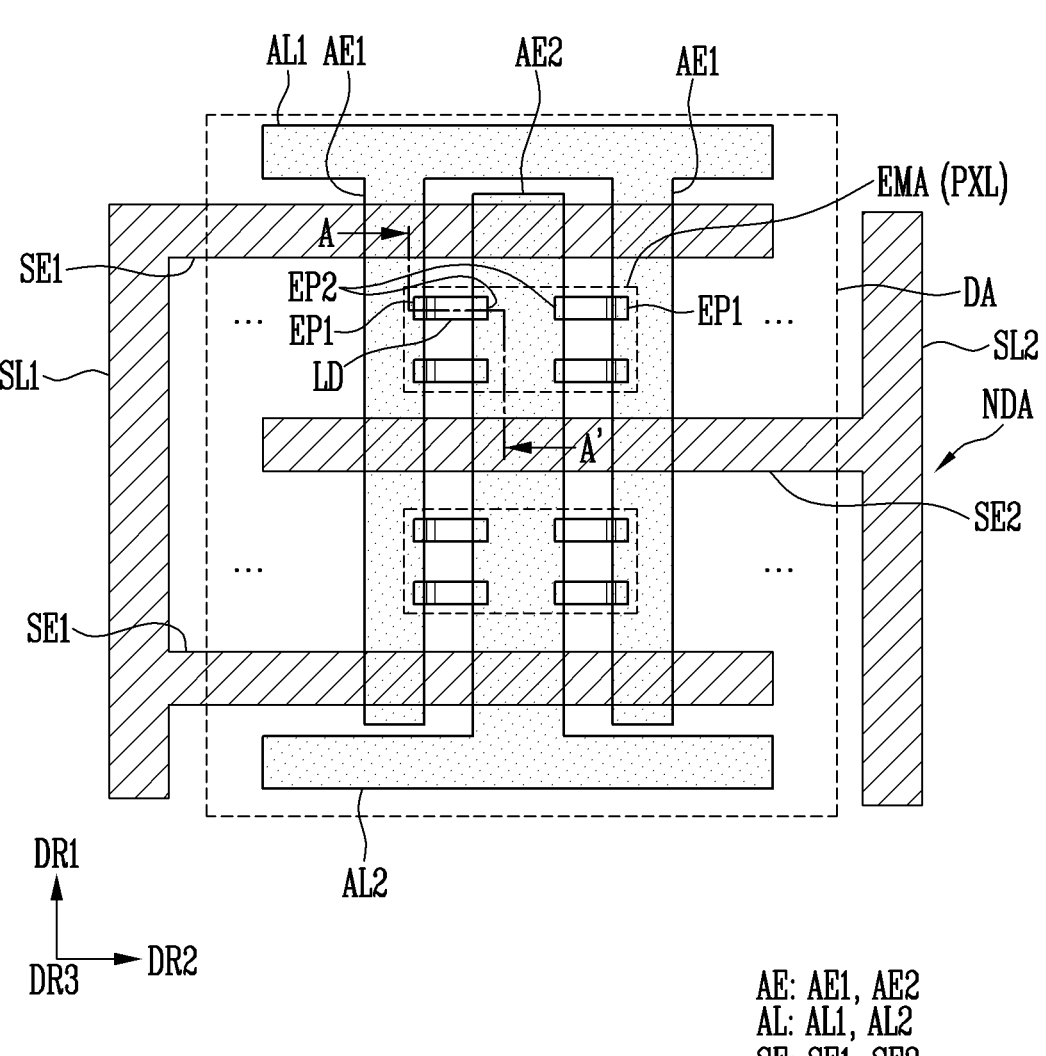
FIGS. 4 to 7 are schematic plan views illustrating a pixel according to an embodiment.

The auxiliary electrodes SE may extend in a direction while crossing the pixels PXL. For example, as shown in FIG. 4, the auxiliary electrodes SE may extend in the second direction DR2 and may be spaced apart from each other in the first direction DR1. Each of first and second auxiliary electrodes SE1 and SE2 may extend in the second direction DR2 and may be alternately disposed in the first direction DR1.

According to an embodiment, as shown in FIG. 5, the auxiliary electrodes SE may extend in a fourth direction DR4, which is a diagonal direction crossing the first direction DR1 and the second direction DR2, and may be spaced apart from each other in a fifth direction DR5 crossing the fourth direction DR4. Each of first and second auxiliary electrodes SE1 and SE2 may extend in the fourth direction DR4 and may be alternately disposed in the fifth direction DR5.

The auxiliary electrodes SE may receive an auxiliary signal in the step of aligning the light emitting elements LD. Accordingly, the light emitting elements LD may be arranged in the first direction DR1 (or the fifth direction DR5) in a biased state between the auxiliary electrodes SE. A pair of auxiliary electrodes SE adjacent to each other may receive different signals during a bias alignment direction of the light emitting elements LD. For example, in case that the first and second auxiliary electrodes SE1 and SE2 are alternately arranged, the first auxiliary electrode SE1 and the second auxiliary electrode SE2 may receive different auxiliary signals. A step of biasedly aligning the light emitting elements LD using the auxiliary electrodes SE is described later with reference to FIGS. 12, 16, and the like.

The auxiliary electrodes SE may be electrically connected to the auxiliary lines SL. The auxiliary lines SL may provide an auxiliary signal to the auxiliary electrodes SE. A first auxiliary line SL1 may be electrically connected to the first auxiliary electrode SE1, and a second auxiliary line SL2 may be electrically connected to the second auxiliary electrode SE2.

The auxiliary lines SL may be disposed in the non-display area NDA. The auxiliary lines SL may extend in the first direction DR1 and may be spaced apart from each other in the second direction DR2.

Each of the light emitting elements LD may be aligned between a pair of alignment electrodes AE in the emission area EMA. The first end EP1 of the light emitting elements LD may be adjacent to the first alignment electrode AE1, and the second end EP2 of the light emitting elements LD may be adjacent to the second alignment electrode AE2. The first end EP1 of the light emitting elements LD may face the first alignment electrode AE1, and the second end EP2 of the light emitting elements LD may face the second alignment electrode AE2. The first end EP1 of the light emitting elements LD may overlap the first alignment electrode AE1, and the second end EP2 of the light emitting elements LD may overlap the second alignment electrode AE2. For example, the light emitting elements LD may be biasedly aligned between the first and second alignment electrodes AE1 and AE2.

Each of the light emitting elements LD may be electrically connected between a pair of connection electrodes CE. As shown in FIG. 6, a first light emitting element LD1 may be electrically connected between first and second connection electrodes CE1 and CE2. For example, the first end EP1 of the first light emitting element LD1 may be electrically connected to the first connection electrode CE1, and the second end EP2 of the first light emitting element LD1 may be electrically connected to the second connection electrode CE2.

The second light emitting element LD2 may be electrically connected between second and third connection electrodes CE2 and CE3. The first end EP1 of the second light emitting element LD2 may be electrically connected to the second connection electrode CE2, and the second end EP2 of the second light emitting element LD2 may be electrically connected to the third connection electrode CE3.

The first connection electrode CE1 may be disposed on the first ends EP1 of the first light emitting elements LD1 and electrically connected to the first ends EP1 of the first light emitting elements LD1.

A first area of the second connection electrode CE2 may be disposed on the second ends EP2 of the first light emitting elements LD1 and electrically connected to the second ends EP2 of the first light emitting elements LD1.

A second area of the second connection electrode CE2 may be disposed on the first ends EP1 of the second light emitting elements LD2 and electrically connected to the first ends EP1 of the second light emitting elements LD2.

A third area may be disposed between the first area and the second area of the second connection electrode CE2. The first area and the second area of the second connection electrode CE2 may be connected by the third area. Accordingly, the second connection electrode CE2 may electrically connect the second ends EP2 of the first light emitting elements LD1 and the first ends EP1 of the second light emitting elements LD2. The first to third areas of the second connection electrode CE2 may be integrally provided. For example, the first to third areas of the second connection electrode CE2 may be simultaneously formed in the same process.

The third connection electrode CE3 may be disposed on the second ends EP2 of the second light emitting elements LD2 and electrically connected to the second ends EP2 of the second light emitting elements LD2.

The first to third connection electrodes CE1, CE2, and CE3 may be formed of the same conductive layer. According to an embodiment, the first to third connection electrodes CE1, CE2, and CE3 may be formed of multiple conductive layers. For example, the first connection electrode CE1 and the third connection electrode CE3 may be formed of a first conductive layer, and the second connection electrode CE2 may be formed of a second conductive layer different from the first conductive layer.

According to an embodiment, as shown in FIG. 7, the first light emitting element LD1 may be electrically connected between the first and second connection electrodes CE1 and CE2. For example, the first end EP1 of the first light emitting element LD1 may be electrically connected to the first connection electrode CE1, and the second end EP2 of the first light emitting element LD1 may be electrically connected to the second connection electrode CE2.

The second light emitting element LD2 may be electrically connected between the second and third connection electrodes CE2 and CE3. The first end EP1 of the second light emitting element LD2 may be electrically connected to the second connection electrode CE2, and the second end EP2 of the second light emitting element LD2 may be electrically connected to the third connection electrode CE3.

The third light emitting element LD3 may be electrically connected between third and fourth connection electrodes CE3 and CE4. The first end EP1 of the third light emitting element LD3 may be electrically connected to the third connection electrode CE3, and the second end EP2 of the third light emitting element LD3 may be electrically connected to the fourth connection electrode CE4.

The fourth light emitting element LD4 may be electrically connected between fourth and fifth connection electrodes CE4 and CE5. The first end EP1 of the fourth light emitting element LD4 may be electrically connected to the fourth connection electrode CE4, and the second end EP2 of the fourth light emitting element LD4 may be electrically connected to the fifth connection electrode CE5.

Each of the connection electrodes CE may be provided in at least the emission area EMA, and may be disposed to overlap at least one alignment electrode AE and/or the light emitting element LD. For example, each of the connection electrodes CE may be formed on the alignment electrodes AE and/or the light emitting elements LD to overlap the alignment electrodes AE and/or the light emitting elements LD, and electrically connected to the light emitting elements LD.

The first connection electrode CE1 may be disposed on the first ends EP1 of the first light emitting elements LD1 and electrically connected to the first ends EP1 of the first light emitting elements LD1.

The first area of the second connection electrode CE2 may be disposed on the second ends EP2 of the first light emitting elements LD1, and electrically connected to the second ends EP2 of the first light emitting elements LD1.

The second area of the second connection electrode CE2 may be disposed on the first ends EP1 of the second light emitting elements LD2, and electrically connected to the first ends EP1 of the second light emitting elements LD2.

The third area may be disposed between the first area and the second area of the second connection electrode CE2. The first area and the second area of the second connection electrode CE2 may be connected by the third area. Accordingly, the second connection electrode CE2 may electrically connect the second ends EP2 of the first light emitting elements LD1 and the first ends EP1 of the second light emitting elements LD2. The first to third areas of the second connection electrode CE2 may be integrally provided. For example, the first to third areas of the second connection electrode CE2 may be simultaneously formed in the same process.

A first area of the third connection electrode CE3 may be disposed on the second ends EP2 of the second light emitting elements LD2, and electrically connected to the second ends EP2 of the second light emitting elements LD2.

A second area of the third connection electrode CE3 may be disposed on the first ends EP1 of the third light emitting elements LD3, and electrically connected to the first ends EP1 of the third light emitting elements LD3.

A third area may be disposed between the first area and the second area of the third connection electrode CE3. The first area and the second area of the third connection electrode CE3 may be connected by the third area. Accordingly, the third connection electrode CE3 may electrically connect the second ends EP2 of the second light emitting elements LD2 and the first ends EP1 of the third light emitting elements LD3. The first to third areas of the third connection electrode CE3 may be integrally provided. For example, the first to third areas of the third connection electrode CE3 may be simultaneously formed in the same process.

A first area of the fourth connection electrode CE4 may be disposed on the second ends EP2 of the third light emitting elements LD3, and electrically connected to the second ends EP2 of the third light emitting elements LD3.

A second area of the fourth connection electrode CE4 may be disposed on the first ends EP1 of the fourth light emitting elements LD4, and electrically connected to the first ends EP1 of the fourth light emitting elements LD4.

A third area may be disposed between the first area and the second area of the fourth connection electrode CE4. The first area and the second area of the fourth connection electrode CE4 may be connected by the third area. Accordingly, the fourth connection electrode CE4 may electrically connect the second ends EP2 of the third light emitting elements LD3 and the first ends EP1 of the fourth light emitting elements LD4. The first to third areas of the fourth connection electrode CE4 may be integrally provided. For example, the first to third areas of the fourth connection electrode CE4 may be simultaneously formed in the same process.

The fifth connection electrode CE5 may be disposed on the second ends EP2 of the fourth light emitting elements LD4 and electrically connected to the second ends EP2 of the fourth light emitting elements LD4.

The first to fifth connection electrodes CE1, CE2, CE3, CE4, and CE5 may be formed of the same conductive layer. According to an embodiment, the first to fifth connection electrodes CE1, CE2, CE3, CE4, and CE5 may be formed of multiple conductive layers. For example, the first connection electrode CE1, the third connection electrode CE3, and/or the fifth connection electrode CE5 may be formed of a first conductive layer, and the second connection electrode CE2 and the fourth connection electrode CE4 may be formed of a second conductive layer different from the first conductive layer. An insulating layer may be disposed between the first conductive layer and the second conductive layer.

As described above, in case that the light emitting elements LD are connected in series/parallel structure, power efficiency may be improved compared to a case where the same number of light emitting elements LD are connected only in parallel. In the pixel PXL in which the light emitting elements LD are connected in the series/parallel structure, even though a short circuit defect or the like occurs in a partial series stage, a predetermined or selected luminance may be expressed through the light emitting elements LD of a remaining series stage, and thus a dark spot defect possibility of the pixel PXL may be reduced. However, the disclosure is not necessarily limited thereto, and a light emitting unit LD may be configured by connecting the light emitting elements only in series or the light emitting unit LD may be configured by connecting the light emitting elements LD only in parallel.

Hereinafter, a cross-sectional structure of the pixel PXL is described in detail with reference to FIG. 8. FIG. 8 schematically illustrates a cross-sectional structure of a pixel circuit layer PCL and a display element layer DPL according to an embodiment. In FIG. 8, one pixel PXL is simplified, such as showing each electrode as a single layer of electrode and each insulating layer as only a single layer of insulating layer, but the disclosure is not limited thereto.

In an embodiment of the disclosure, "connection" between two configurations may mean that both an electrical connection and a physical connection are used inclusively.

Referring to FIG. 8, each pixel PXL may include the pixel circuit layer PCL and the display element layer DPL disposed on the substrate SUB.

The pixel circuit layer PCL may include a buffer layer BFL, a transistor T, and a protective layer PSV.

The buffer layer may be provided and/or formed on the substrate SUB, and may prevent an impurity from diffusing into the transistor T. The buffer layer BFL may be an inorganic insulating layer including an inorganic material. The buffer layer BFL may include at least one of a metal oxide such as silicon nitride (SiNx), silicon oxide (SiOx), silicon oxynitride (SiOxNy), or aluminum oxide (AlOx). The buffer layer BFL may be provided as a single layer, or may be provided as a multilayer of at least a double layer. In case that the buffer layer BFL is provided as the multilayer, each layer may be formed of the same material or different materials. The buffer layer BFL may be omitted according to a material, a process condition, and the like of the substrate SUB.

The transistor T may be a driving transistor that controls a driving current provided to the light emitting element LD. However, the disclosure is not limited thereto, and the transistor T may be a switching transistor that transfers a signal to the driving transistor or performs another function in addition to the driving transistor.

The transistor T may include a semiconductor pattern SCL, a gate electrode GE, a first terminal TE1, and a second terminal TE2. The first terminal TE1 may be one of a source electrode and a drain electrode, and the second terminal TE2 may be the other electrode. For example, in case that the first terminal TE1 is a source electrode, the second terminal TE2 may be a drain electrode.

The semiconductor pattern SCL may be provided and/or formed on the buffer layer BFL. The semiconductor pattern SCL may include a first contact region contacting the first terminal TE1 and a second contact region contacting the second terminal TE2. A region between the first contact region and the second contact region may be a channel region. The channel region may overlap the gate electrode GE of the corresponding transistor T. The semiconductor pattern SCL may be a semiconductor pattern formed of amorphous silicon, poly silicon, low temperature poly silicon, an oxide semiconductor, an organic semiconductor, and/or the like. The channel region is, for example, a semiconductor pattern that is not doped with an impurity, and may be an intrinsic semiconductor. The first contact region and the second contact region may be semiconductor patterns doped with an impurity.

The gate electrode GE may be provided and/or formed on a gate insulating layer GI to correspond to the channel region of the semiconductor pattern SCL. The gate electrode GE may be provided on the gate insulating layer GI and may overlap the channel region of the semiconductor pattern SCL. The gate electrode GE may be formed in a single layer of a material selected from a group consisting of copper (Cu), molybdenum (Mo), tungsten (W), aluminum neodymium (AlNd), titanium (Ti), aluminum (Al), silver (Ag), and an alloy thereof alone or a mixture thereof, or may be formed in a double layer or multilayer structure of a molybdenum (Mo), titanium (Ti), copper (Cu), aluminum (Al) or silver (Ag), which is a low-resistance material, to reduce a line resistance.

The gate insulating layer GI may be an inorganic insulating layer including an inorganic material. For example, the gate insulating layer GI may include at least one of a metal oxide such as silicon nitride (SiNx), silicon oxide (SiOx), silicon oxynitride (SiOxNy), and aluminum oxide (AlOx). However, the material of the gate insulating layer GI is not limited to the above-described embodiments, and various materials providing insulation to the gate insulating layer GI may be applied according to an embodiment. For example, the gate insulating layer GI may be formed of an organic insulating layer including an organic material. The gate insulating layer GI may be provided as a single layer, but may also be provided as a multilayer of at least a double layer.

Each of the first terminal TE1 and the second terminal TE2 may be provided and/or formed on the second interlayer insulating layer ILD2, and may be in contact with the first contact region and the second contact region of the semiconductor pattern SCL through a contact hole sequentially passing through the gate insulating layer GI and the first and second interlayer insulating layers ILD1 and ILD2. For example, the first terminal TE1 may be in contact with the first contact region of the semiconductor pattern SCL, and the second terminal TE2 may be in contact with the second contact region of the semiconductor pattern SCL. Each of the first and second terminals TE1 and TE2 may include the same material as the gate electrode GE, or may include one or more materials selected from the material discussed as the configuration material of the gate electrode GE.

The first interlayer insulating layer ILD1 may include the same material as the gate insulating layer GI, or may include one or more materials selected from the material discussed as the configuration material of the gate insulating layer GI.

The second interlayer insulating layer ILD2 may be provided and/or formed on the first interlayer insulating layer ILD1. The second interlayer insulating layer ILD2 may be an inorganic insulating layer including an inorganic material or an organic insulating layer including an organic material. According to an embodiment, the second interlayer insulating layer ILD2 may include the same material as the first interlayer insulating layer ILD1, but the disclosure is not limited thereto. The second interlayer insulating layer ILD2 may be provided as a single layer, or may be provided as a multilayer of at least a double layer. According to an embodiment, the second interlayer insulating layer ILD2 may be omitted.

In an above-described embodiment, the first and second terminals TE1 and TE2 of the transistor T are separate electrodes electrically connected to the semiconductor pattern SCL through the contact hole sequentially passing through the gate insulating layer GI and the first and second interlayer insulating layers ILD1 and ILD2, but the disclosure is not limited thereto. According to an embodiment, the first terminal TE1 of the transistor T may be a first contact region adjacent to the channel region of the semiconductor pattern SCL, and the second terminal TE2 of the transistor T may be a second contact region adjacent to the channel region of the semiconductor pattern SCL. The second terminal TE2 of the transistor T may be electrically connected to the light emitting element LD of the pixel PXL through a separate connection such as a bridge electrode.

The transistor T may be configured of a low temperature polysilicon thin film transistor (LTPS TFT), but the disclosure is not limited thereto. According to an embodiment, the transistors T may be configured of an oxide semiconductor thin film transistor. Although a case in which the transistor T is a thin film transistor of a top gate structure has been described as an example in an above-described embodiment, the disclosure is not limited thereto, and a structure of the transistor T may be variously changed. For example, the transistor T may be a thin film transistor having a bottom gate structure.

The pixel circuit layer PCL may further include a storage capacitor storing a voltage applied between a gate electrode and the first terminal TE1 (or the source electrode) of the transistor T, a driving voltage line providing a driving voltage to the transistor T (or the pixel PXL), and the like.

The protective layer PSV may be provided and/or formed on the transistor T. The protective layer PSV may be provided in a form including an organic insulating layer, an inorganic insulating layer, or an organic insulating layer disposed on an inorganic insulating layer. The inorganic insulating layer may include, for example, at least one of a metal oxide such as silicon oxide (SiOx), silicon nitride (SiNx), silicon oxynitride (SiOxNy), or aluminum oxide (AlOx). The organic insulating layer may include, for example, at least one of acrylic resin (polyacrylates resin), epoxy resin, phenolic resin, polyamides resin, polyimide resin, unsaturated polyesters resin, poly-phenylen ethers resin, poly-phenylene sulfides resin, and benzocyclobutene resin.

The display element layer DPL may be provided on the protective layer PSV. The display element layer DPL may include the auxiliary electrodes SE, bank patterns BNP, the alignment electrodes AE, the light emitting elements LD, and/or the connection electrodes CE. The display element layer DPL may include first to fourth insulating layers INS1, INS2, INS3, and INS4.

The auxiliary electrodes SE may be disposed on the protective layer PSV of the pixel circuit layer PCL. The auxiliary electrodes SE may be used as auxiliary alignment electrodes for bias alignment of the light emitting elements LD by receiving an auxiliary signal. For example, the first auxiliary electrode SE1 may be used as a first auxiliary electrode by receiving a first auxiliary signal, and the second auxiliary electrode SE2 may be used as a second auxiliary electrode by receiving a second auxiliary signal. After the light emitting element LD is biasedly aligned in the pixel PXL, the auxiliary electrodes SE may be floated, but are not necessarily limited thereto. The step of biasedly aligning the light emitting elements LD using the auxiliary electrodes SE is described later with reference to FIGS. 12 and 16.

The auxiliary electrodes SE may be formed of a reflective material to guide light emitted from the light emitting element LD in an image display direction of the display panel PNL. The auxiliary electrodes SE may be formed of a reflective conductive material. The conductive material may include an opaque metal that is advantageous for reflecting the light emitted from the light emitting element LD in the image display direction of the display panel PNL. The opaque metal may include, for example, a metal such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and an alloy thereof. According to an embodiment, the auxiliary electrodes SE may include a transparent conductive material. The transparent conductive material may include a conductive oxide or the like such as indium tin oxide (ITO), indium zinc oxide (IZO), indium gallium zinc oxide (IGZO), or indium tin zinc oxide (ITZO). In case that the auxiliary electrodes SE include the transparent conductive material, a separate conductive layer formed of opaque metal may be added to reflect the light emitted from the light emitting element LD in the image display direction of the display panel PNL. However, a material of each of the auxiliary electrodes SE is not limited to the above-described materials.

The auxiliary electrodes SE may be provided and/or formed as a single layer, but the disclosure is not limited thereto. According to an embodiment, the auxiliary electrodes SE may be provided and/or formed as multiple layers in which at least two or more materials among metals, alloys, conductive oxides, and conductive polymers are stacked on each other.

The first insulating layer INS1 may be disposed on the auxiliary electrodes SE. The first insulating layer INS1 may include an inorganic insulating layer formed of an inorganic material or an organic insulating layer formed of an organic material. For example, the first insulating layer INS1 may include at least one of metal oxides such as silicon nitride (SiNx), silicon oxide (SiOx), silicon oxynitride (SiOxNy), and aluminum oxide (AlOx), but the disclosure is not limited thereto.

The bank patterns BNP may be disposed on the first insulating layer INS1. The bank patterns BNP may be positioned in the emission area EMA of FIG. 4 and may be disposed to be spaced apart from each other. The bank patterns BNP may change a surface profile (or shape) of each of the alignment electrodes AE in the third direction DR3. For example, the bank patterns BNP may be a support member supporting each of the alignment electrodes AE to guide the light emitted from the light emitting elements LD in the image display direction (for example, a front surface direction) of the display panel PNL. For example, the bank patterns BNP may be provided and/or formed between the protective layer PSV and a corresponding electrode in the emission area EMA of a corresponding pixel PXL.

The bank patterns BNP may be an inorganic insulating layer including an inorganic material or an organic insulating layer including an organic material. According to an embodiment, the bank patterns BNP may include a single layer of organic insulating layer and/or a single layer of inorganic insulating layer, but the disclosure is not limited thereto. According to an embodiment, the bank patterns BNP may be provided in a form of multiple layers in which at least one organic insulating layer and at least one inorganic insulating layer are stacked on each other. However, a material of the bank patterns BNP is not limited to the above-described embodiments.

The bank patterns BNP may have a cross-section of a trapezoidal shape of which a width becomes narrower toward an upper portion along the third direction DR3, but the disclosure is not limited thereto. According to an embodiment, the bank patterns BNP may include a curved surface having a cross-section of a semi-elliptical shape, a semi-circular shape (or a hemispherical shape), or the like of which a width becomes narrower toward an upper portion along the third direction DR3. A cross-sectional shape of the bank patterns BNP is not limited to the above-described embodiments and may be variously changed within a range capable of improving efficiency of light emitted from each of the light emitting elements LD.

In the above-described embodiment, a case where the bank patterns BNP are disposed as a separate layer on the first insulating layer INS1 is an example, but the disclosure is not limited thereto. According to an embodiment, the bank patterns BNP and the first insulating layer INS1 may be formed through the same process using a halftone mask.

The alignment electrodes AE may be disposed on the bank patterns BNP. Each of the alignment electrodes AE may be formed of a reflective material to allow the light emitted from the light emitting element LD to proceed in the image display direction of the display panel PNL. Each of the alignment electrodes AE may be formed of a reflective conductive material. The conductive material may include an opaque metal that is advantageous for reflecting the light emitted from the light emitting element LD in the image display direction of the display panel PNL. The opaque metal may include, for example, a metal such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and an alloy thereof. According to an embodiment, each of the alignment electrodes AE may include a transparent conductive material. The transparent conductive material may include a conductive oxide such as indium tin oxide (ITO), indium zinc oxide (IZO), indium gallium zinc oxide (IGZO), and/or indium tin zinc oxide (ITZO).

In case that each of the alignment electrodes AE includes the transparent conductive material, a separate conductive layer formed of an opaque metal may be added to reflect the light emitted from the light emitting element LD in the image display direction of the display panel PNL. However, a material of each of the alignment electrodes AE is not limited to the above-described materials.

Each of the alignment electrodes AE may be provided and/or formed as a single layer, but the disclosure is not limited thereto. According to an embodiment, each of the alignment electrodes AE may be provided and/or formed as multiple layers in which at least two or more materials among metals, alloys, conductive oxides, and conductive polymers are stacked on each other. Each of the alignment electrodes AE may be formed as multiple layers of at least double layers to minimize distortion due to signal delay in case that a signal (or a voltage) is transferred to both ends of each of the light emitting elements LD. For example, each of the alignment electrodes AE may be formed as multiple layers in which indium tin oxide (ITO)/silver (Ag)/indium tin oxide (ITO) are sequentially stacked on each other.

According to an embodiment, the first alignment electrode AE1 may be electrically connected to the above-described transistor T, and the second alignment electrode AE2 may be electrically connected to the driving voltage line of the pixel circuit layer PCL, but the disclosure is not necessarily limited thereto.

Each of the first alignment electrode AE1 and the second alignment electrode AE2 may be used as an electrode for aligning the light emitting elements LD by receiving the alignment signal. For example, the first alignment electrode AE1 may receive the first alignment signal, and the second alignment electrode AE2 may receive the second alignment signal. After the light emitting element LD is aligned, the first alignment electrode AE1 and the second alignment electrode AE2 may be used as a driving electrode for driving the light emitting elements LD. For example, after the light emitting element LD is aligned in the pixel PXL, some of the alignment electrodes AE positioned between adjacent pixels PXL to individually (or independently) drive the pixels PXL may be removed, but the disclosure is not necessarily limited thereto.

FIG. 8 shows an embodiment in which the alignment electrodes AE are formed on the auxiliary electrodes SE, but the disclosure is not necessarily limited thereto. According to an embodiment, the alignment electrodes AE may be disposed on the pixel circuit layer PCL, the first insulating layer INS1 may be disposed on the alignment electrodes AE, and the auxiliary electrodes SE may be disposed on the first insulating layer INS1.

The second insulating layer INS2 may be disposed on the alignment electrodes AE. The second insulating layer INS2 may include an inorganic insulating layer formed of an inorganic material or an organic insulating layer formed of an organic material. The second insulating layer INS2 may be formed of an inorganic insulating layer that is advantageous for protecting the light emitting element LD from the pixel circuit layer PCL of the pixel PXL. For example, the second insulating layer INS2 may include at least one of metal oxides such as silicon nitride (SiNx), silicon oxide (SiOx), silicon oxynitride (SiOxNy), and aluminum oxide (AlOx), but the disclosure is not limited thereto. According to an embodiment, the second insulating layer INS2 may be formed of an organic insulating layer to planarize a support surface of the light emitting elements LD.

The light emitting elements LD may be provided on the second insulating layer INS2. The light emitting elements LD may be disposed between the alignment electrodes AE between the bank patterns BNP.

At least two to several tens of light emitting elements LD may be aligned and/or provided in the emission area EMA, but the number of light emitting elements LD aligned and/or provided in the emission area EMA is not limited thereto. According to an embodiment, the number of light emitting elements LD aligned and/or provided in the emission area EMA may be variously changed.

Each of the light emitting elements LD may emit any of color light and/or white light. In an embodiment, each of the light emitting elements LD may emit blue light of a short wavelength range, but the disclosure is not limited thereto.

The third insulating layer INS3 may be disposed on the light emitting element LD. The third insulating layer INS3 may be partially disposed on the light emitting elements LD, and may expose the first and second ends EP1 and EP2 of the light emitting elements LD.

The third insulating layer INS3 may be configured as a single layer or multiple layers, and may include an inorganic insulating layer including at least one inorganic material or an organic insulating layer including at least one organic material. According to an embodiment, the third insulating layer INS3 may be formed of an inorganic insulating layer including an inorganic material or an organic insulating layer including an organic material. By forming the third insulating layer INS3 on the light emitting element LD after the alignment of the light emitting element LD in the pixel PXL is completed, the light emitting element LD may be prevented from being separated from an aligned position.

The connection electrodes CE may be disposed on the light emitting elements LD and the third insulating layer INS3. The first connection electrode CE1 may be disposed on the first end EP1 of the light emitting element LD exposed by the third insulating layer INS3. The first connection electrode CE1 may contact the first end EP1 of the light emitting elements LD. The second connection electrode CE2 may be disposed on the second end EP2 of the light emitting element LD exposed by the third insulating layer INS3. The second connection electrode CE2 may contact the second end EP2 of the light emitting elements LD.

The connection electrodes CE may be formed of various transparent conductive materials to allow the light emitted from the light emitting element LD and reflected by the alignment electrodes AE to proceed in the image display direction of the display panel PNL without loss. For example, the connection electrodes CE may include at least one of various transparent conductive materials (or substances) including indium tin oxide (ITO), indium zinc oxide (IZO), indium gallium zinc oxide (IGZO), and indium tin zinc oxide (ITZO), and may be configured to be substantially transparent or translucent to satisfy light transmittance (or transmittance). However, a material of the connection electrodes CE is not limited to the above-described embodiment. According to an embodiment, the connection electrodes CE may be formed of various opaque conductive materials (or substances). The connection electrodes CE may be formed of a single layer or multiple layers.

A shape of the connection electrodes CE is not limited to a specific shape, and may be variously changed within a range in which the connection electrodes CE are electrically connected to the light emitting element LD stably. The shapes of the connection electrodes CE may be variously changed in consideration of a connection relationship with an electrode disposed thereunder.

The connection electrodes CE may be disposed on the same layer as each other, but are not necessarily limited thereto. According to an embodiment, the connection electrodes CE may be formed of multiple conductive layers, and an insulating layer may be disposed between the conductive layers.

The fourth insulating layer INS4 may be provided and/or formed on the connection electrodes CE. The fourth insulating layer INS4 may be an inorganic insulating layer including an inorganic material or an organic insulating layer including an organic material. For example, the fourth insulating layer INS4 may have a structure in which at least one inorganic insulating layer or at least one organic insulating layer is alternately stacked. The fourth insulating layer INS4 may entirely cover the display element layer DPL to block water, moisture, or the like from entering the display element layer DPL including the light emitting elements LD from outside.

Figure 9:
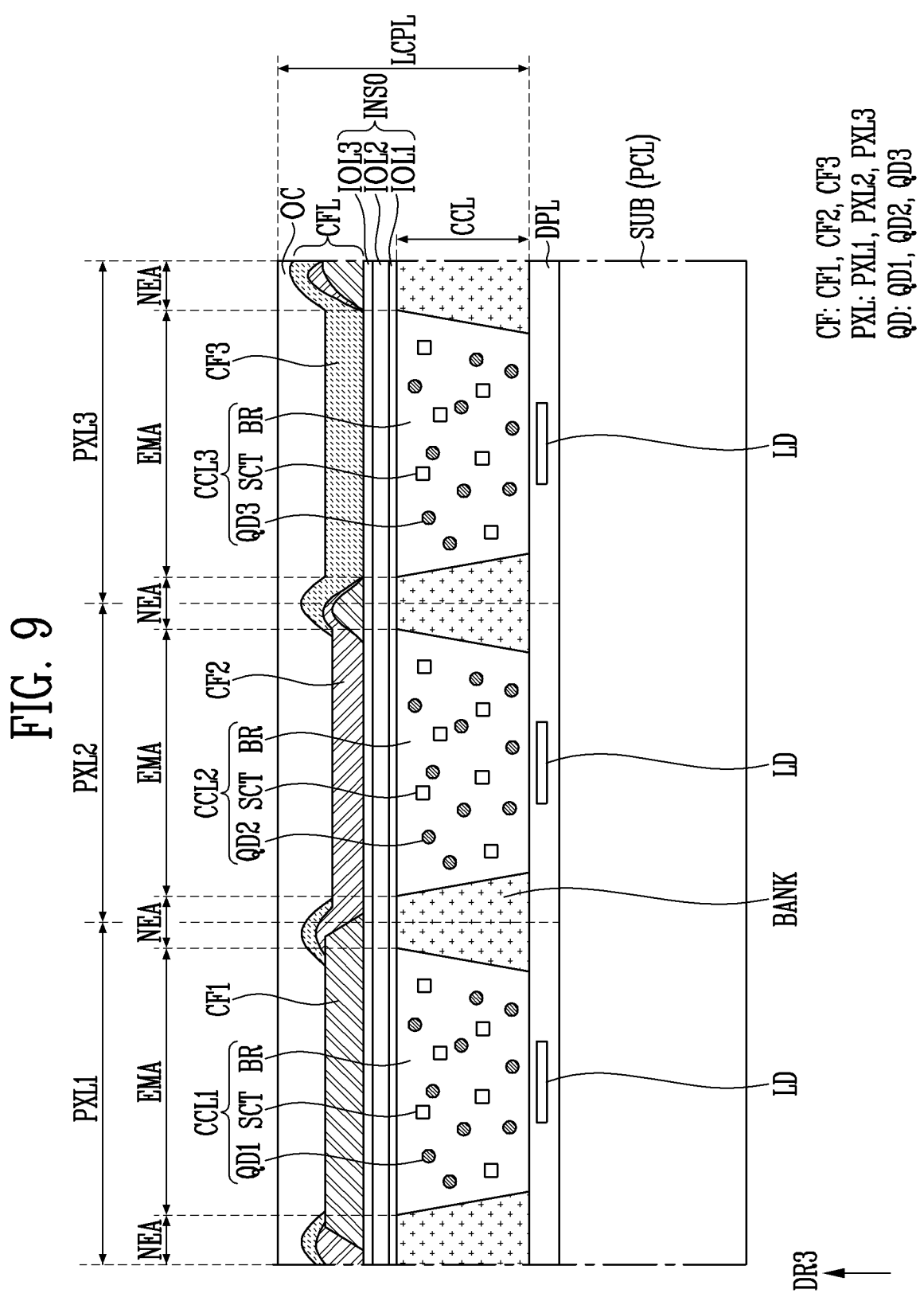
FIG. 9 is a schematic cross-sectional view illustrating a display panel according to an embodiment.

FIG. 9 is a schematic cross-sectional view illustrating a display panel according to an embodiment. In FIG. 9, the display panel PNL is shown based on the display area DA.

Referring to FIG. 9, the substrate SUB may include the first pixel PXL1, the second pixel PXL2, and the third pixel PXL3. According to an embodiment, the first to third pixels PXL1, PXL2, and PXL3 may emit light in different colors. For example, the first pixel PXL1 may be a red pixel emitting red light, the second pixel PXL2 may be a green pixel emitting green light, and the third pixel PXL3 may be a blue pixel emitting blue light. However, a color, a type, the number, and/or the like of the pixels is/are not particularly limited, and, for example, the color of light emitted by each of the pixels may be variously changed. According to an embodiment, the first to third pixels PXL1, PXL2, and PXL3 may emit light in the same color. For example, each of the first to third pixels PXL1, PXL2, and PXL3 may be a blue pixel emitting blue light.

The pixel circuit layer PCL and the display element layer DPL may be disposed on the substrate SUB. For convenience of description, the pixel circuit layer PCL is shown together with the substrate SUB, but as described with reference to FIG. 7, the pixel circuit layer PCL may be disposed between the substrate SUB and the display element layer DPL.

The display element layer DPL may include a light emitting element LD provided in each emission area EMA. The light emitting element LD may be configured of an inorganic light emitting diode such as a quantum dot light emitting diode or an organic light emitting diode. In an embodiment, the light emitting element LD may be an ultra-small light emitting diode, for example, having a size as small as a nano scale to a micro scale, using a material of an inorganic crystal structure. The light emitting elements LD may be connected to each other in parallel and/or in series with the light emitting element LD disposed adjacently in each pixel PXL, but the disclosure is not limited thereto. The light emitting element LD may configure a light source of each pixel PXL. In other words, each pixel PXL may include at least one light emitting element LD driven by a signal (for example, a scan signal and a data signal) and/or power (for example, first driving power and second driving power.

The light conversion pattern layer LCPL may include a color conversion layer CCL, an insulating layer INS0 (or a refractive index conversion layer), a color filter layer CFL (or a color filter CF), and an overcoat layer OC.

The color conversion layer CCL may include a bank BANK and first to third color conversion patterns CCL1, CCL2, and CCL3 (or first to third color conversion layers).

The bank BANK may be disposed on the display element layer DPL. The bank BANK may be positioned in a non-emission area NEA of the first to third pixels PXL1, PXL2, and PXL3. The bank BANK may be formed between the first to third pixels PXL1, PXL2, and PXL3 to surround each emission EMA, and may define each emission area EMA of each of the first to third pixels PXL1, PXL2, and PXL3. The bank BANK may prevent a solution for forming the first to third color conversion patterns CCL1, CCL2, and CCL3 in the emission area EMA from flowing into the emission area EMA of an adjacent pixel, or may function as a dam structure that controls a predetermined or selected amount of solution to be supplied to each emission area EMA.

An opening for exposing the display element layer DPL may be formed in the bank BANK to correspond to the emission area EMA. The first to third color conversion patterns CCL1, CCL2, and CCL3 may be disposed in each opening of the bank BANK.

The first to third color conversion patterns CCL1, CCL2, and CCL3 may include a base resin BR, color conversion particles QD, and light scattering particles SCT. The base resin BR may have high light transmittance and an excellent dispersion characteristic for the color conversion particles QD. For example, the base resin BR may include an organic material such as an epoxy-based resin, an acryl-based resin, a cardo-based resin, and/or an imide-based resin.

The color conversion particles QD may convert light of a color emitted from the light emitting element LD into light of a specific color. For example, in case that the first pixel PXL1 is a red pixel, the first color conversion layer CCL1 may include first color conversion particles QD1 of a red quantum dot converting the light emitted from the light emitting element LD into red light. As another example, in case that the second pixel PXL2 is a green pixel, the second color conversion layer CCL2 may include second color conversion particles QD2 of a green quantum dot converting the light emitted from the light emitting element LD into green light. As still another example, in case that the third pixel PXL3 is a blue pixel, the third color conversion layer CCL3 may include third color conversion particles QD3 of a blue quantum dot converting the light emitted from the light emitting device LD into blue light. According to an embodiment, in case that the light emitting element LD emits blue light, the third color conversion layer CCL3 may not include the third color conversion particles QD3.

The light scattering particles SCT may have a refractive index different from that of the base resin BR and form an optical interface with the base resin BR. The light scattering particles SCT may be metal oxide particles or organic particles. According to an embodiment, the light scattering particles SCT may be omitted.

The insulating layer INS0 may be disposed on the color conversion layer CCL. The insulating layer INS0 may be entirely disposed on the substrate so as to cover the color conversion layer CCL (for example, the bank BANK and the first to third color conversion patterns CCL1, CCL2, and CCL3).

The insulating layer INS0 may include at least three insulating layers, and may recycle light (for example, light proceeding in an oblique direction) emitted from the color conversion layer CCL using a refractive index difference (or total reflection due to the refractive index difference) between the three insulating layers. For example, the light totally reflected by the insulating layer INS0 may be reflected again in the third direction DR3 by the display element layer DPL (or an electrode included in the display element layer DPL and having a specific reflectance), or may be scattered in the third direction DR3 by the color conversion layer CCL (for example, the light scattering particle SCT). Therefore, efficiency (external quantum efficiency, or light output efficiency) of light finally emitted from the pixel PXL through the insulating layer INS0 or an emission luminance of the pixel PXL may be improved.

In embodiments, the insulating layer INS0 may include a first inorganic layer IOL1 (or a first dense film), a second inorganic layer IOL2 (or a low refractive film), and a third inorganic layer IOL3 (or a second dense film) sequentially stacked on each other on the color conversion layer CCL.

The first inorganic layer IOL1 may be disposed on the color conversion layer CCL, and may prevent moisture (or a solution used in a subsequent process) from penetrating into the color conversion layer CCL thereunder. The second inorganic layer IOL2 may be disposed on the first inorganic layer IOL1, and may totally reflect the light (for example, the light proceeding in an oblique direction) emitted from the color conversion layer CCL using a refractive index difference with the first inorganic layer IOL1. The third inorganic layer IOL3 may be disposed on the second inorganic layer IOL2 and may improve adhesion force between the second inorganic layer IOL2 and the color filter layer CFL thereon.

The color filter layer CFL may be disposed on the insulating layer INS0. The color filter layer CFL may include a color filter material that selectively transmits light of a specific color converted by the color conversion layer CCL. The color filter layer CFL may include a red color filter, a green color filter, and a blue color filter. For example, in case that the first pixel PXL1 is a red pixel, a first color filter CF1 that transmits red light may be disposed on the first pixel PXL1. In case that the second pixel PXL2 is a green pixel, a second color filter CF2 that transmits green light may be disposed on the second pixel PXL2. In case that the third pixel PXL3 is a blue pixel, a third color filter CF3 that transmits blue light may be disposed on the third pixel PXL3.

The overcoat layer OC may be disposed on the color filter layer CFL. The overcoat layer OC may be entirely disposed on the substrate SUB to cover a lower configuration, and may encapsulate the display area DA of the display panel PNL.

A method of manufacturing the display device according to the above-described embodiment is now described.

FIGS. 10 to 13 are schematic plan views for each process step of a method of manufacturing a display device according to an embodiment. FIGS. 10 to 13 schematically show a planar structure based on the first alignment electrode AE1, the second alignment electrode AE2, the first auxiliary electrode SE1, and the second auxiliary electrode SE2 of FIG. 4. Hereinafter, substantially the same configurations as those in FIG. 4 are denoted by the same reference numerals, and detailed reference numerals are omitted.

Figure 10:
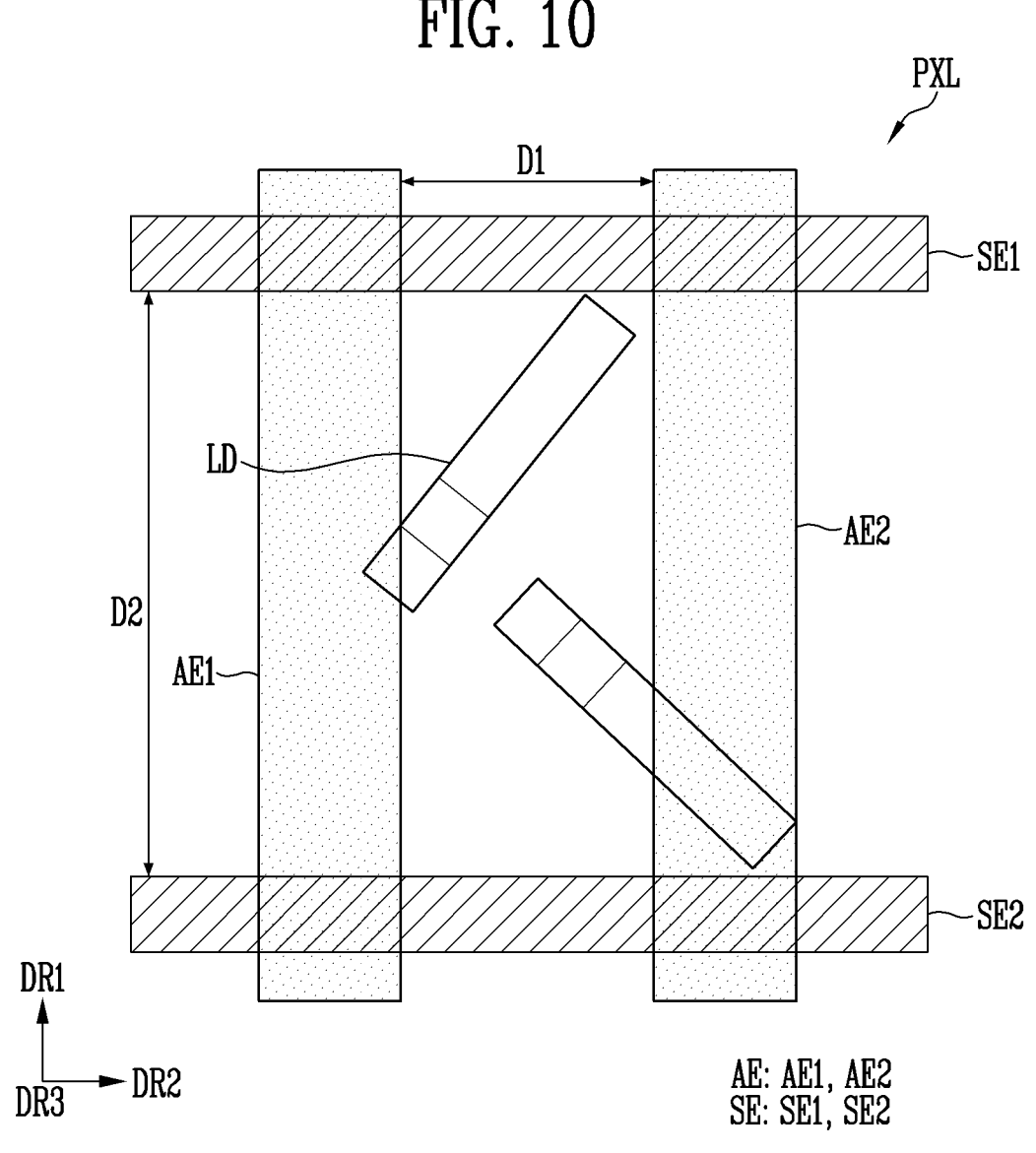

Referring to FIG. 10, first, the alignment electrodes AE1 and AE2 and the auxiliary electrodes SE1 and SE2 may be provided in the pixel PXL. The alignment electrodes AE1 and AE2 may extend in the first direction DR1 and may be spaced apart from each other in the second direction DR2. The auxiliary electrodes SE1 and SE2 may extend in the second direction DR2 and may be spaced apart from each other in the first direction DR1. The alignment electrodes AE1 and AE2 and the auxiliary electrodes SE1 and SE2 may be formed of different conductive layers, and the first insulating layer INS1 may be disposed between the alignment electrodes AE1 and AE2 and the auxiliary electrodes SE1 and SE2.

In an embodiment, a distance D1 of the second direction DR2 between the first alignment electrode AE1 and the second alignment electrode AE2 may be less than a distance D2 of the first direction DR1 between the first auxiliary electrode SE1 and the second auxiliary electrode SE2, but is not necessarily limited thereto. In an embodiment, the first direction DR1 may be perpendicular to the second direction DR2, but is not necessarily limited thereto.

Subsequently, the light emitting elements LD may be provided in the pixel PXL. The light emitting elements LD may be prepared in a form dispersed in a light emitting element ink and supplied through an inkjet printing method or the like. For example, the light emitting elements LD may be provided by being dispersed in a volatile solvent.

Figure 11:
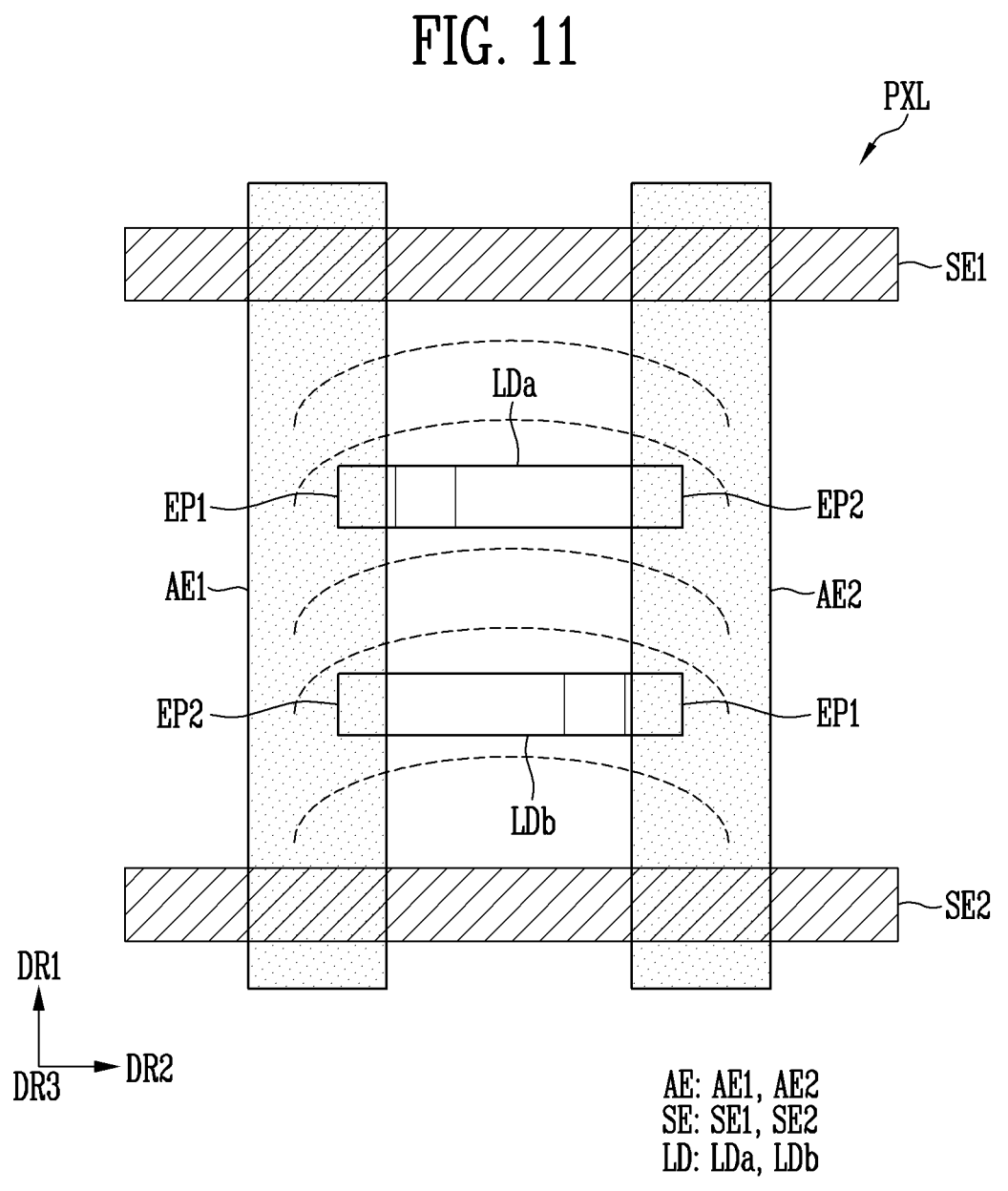

Referring to FIG. 11, subsequently, the light emitting elements LD may be firstly aligned. The alignment signal may be applied to the alignment electrodes AE1 and AE2 to firstly align the light emitting elements LD. In case that the alignment signal is applied to the alignment electrodes AE1 and AE2, an electric field may be formed between the alignment electrodes AE1 and AE2, and thus the light emitting elements LD may move to a space between the alignment electrodes AE1 and AE2 and may be aligned.

The light emitting elements LD may be firstly aligned in a first alignment direction between the alignment electrodes AE1 and AE2. In a process in which the light emitting elements LD are firstly aligned, a direction of the first and second ends EP1 and EP2 of the light emitting elements LD may be randomly aligned. For example, the directions of the first and second ends EP1 and EP2 of each of the light emitting elements LD may be different from each other. For example, the first end EP1 of first light emitting elements LDa may face the first alignment electrode AE1, and the second end EP2 of the first light emitting elements LDa may face the second alignment electrode AE2. The first end EP1 of second light emitting elements LDb may face the second alignment electrode AE2, and the second end EP2 of the second light emitting elements LDb may face the first alignment electrode AE1.

Figure 12:
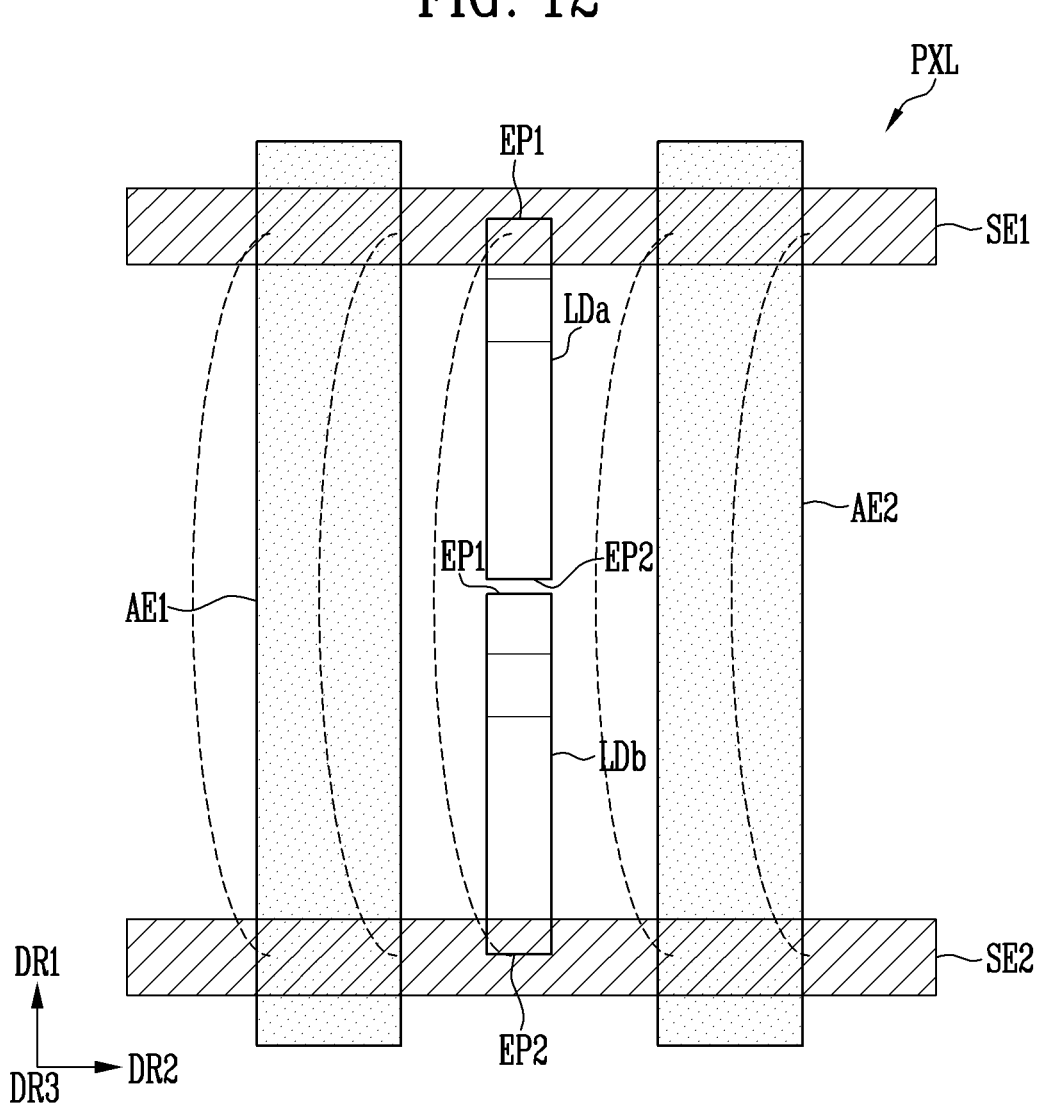

Referring to FIG. 12, subsequently, the light emitting elements LD may be secondly aligned. The auxiliary signal may be applied to the auxiliary electrodes SE1 and SE2 to secondly align the light emitting elements LD. In case that the auxiliary signal is applied to the auxiliary electrodes SE1 and SE2, an electric field may be formed between the auxiliary electrodes SE1 and SE2, and thus the light emitting elements LD may be biasedly aligned between the auxiliary electrodes SE1 and SE2 by rotational torque. In an embodiment, the light emitting elements LD may be secondly aligned in a second alignment direction between the auxiliary electrodes SE1 and SE2. The second alignment direction may cross the first alignment direction described above. For example, the second alignment direction may be perpendicular to the first alignment direction. The second alignment direction may be a direction perpendicular to the second direction DR2 (or the first direction DR1), but is not necessarily limited thereto.

In case that the light emitting elements LD are secondly aligned, the light emitting elements LD may be arranged in the second alignment direction and biasedly aligned. For example, the directions of the first and second ends EP1 and EP2 of each of the light emitting elements LD may be equal to each other. For example, the first end EP1 of the first light emitting elements LDa may face the first auxiliary electrode SE1, and the second end EP2 of the first light emitting elements LDa may face the second auxiliary electrode SE2. The first end EP1 of the second light emitting elements LDb may face the first auxiliary electrode SE1, and the second end EP2 of the second light emitting elements LDb may face the second auxiliary electrode SE2.

Figure 13:
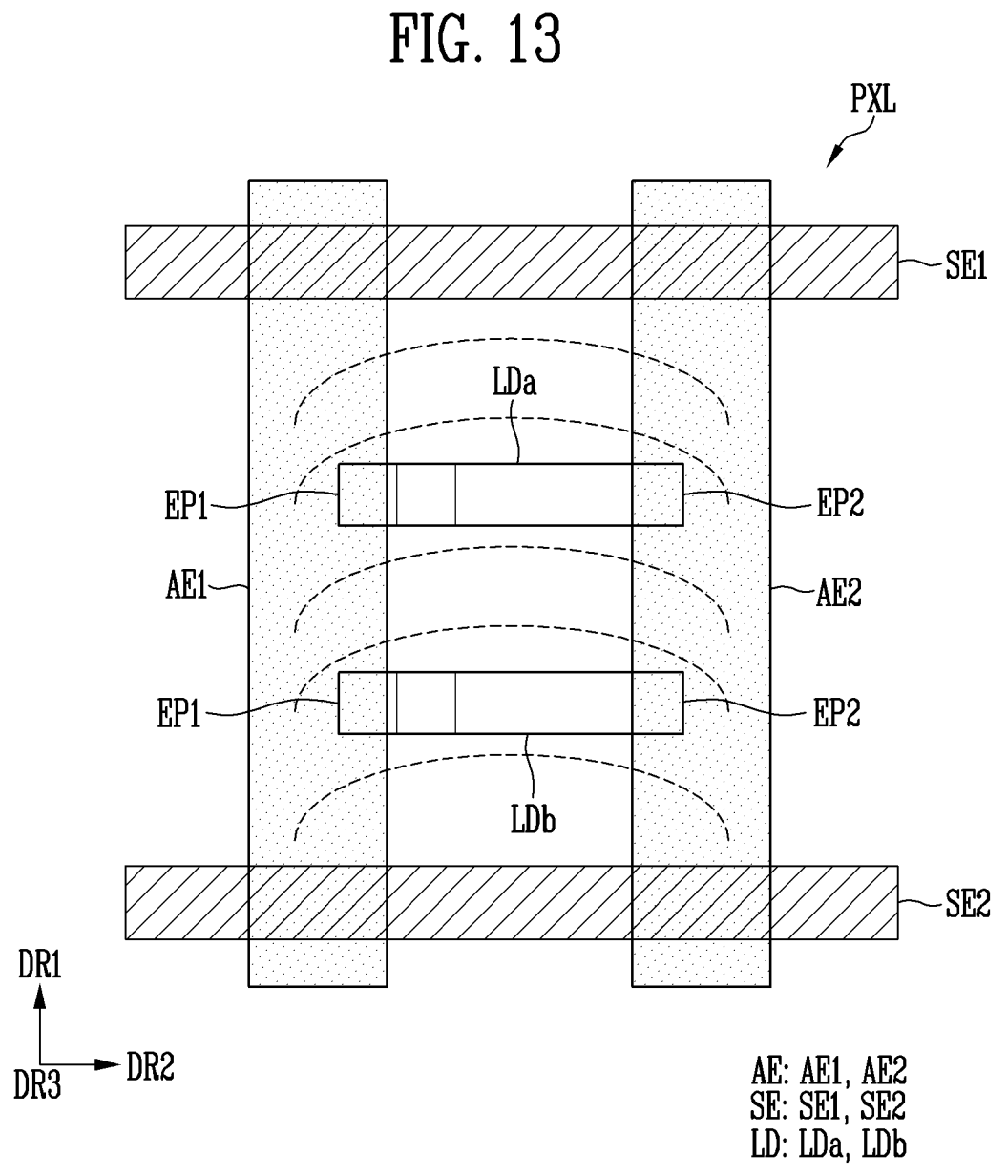

Referring to FIG. 13, subsequently, the light emitting elements LD may be thirdly aligned. The alignment signal may be applied to the alignment electrodes AE1 and AE2 to thirdly align the light emitting elements LD. In case that the alignment signal is applied to the alignment electrodes AE1 and AE2, an electric field may be formed between the alignment electrodes AE1 and AE2, and thus the light emitting elements LD may be aligned in the first alignment direction between the alignment electrodes AE1 and AE2 in a biasedly aligned state. For example, the directions of the first and second ends EP1 and EP2 of each of the light emitting elements LD may be equal to each other. For example, the first end EP1 of the first light emitting elements LDa may face the first alignment electrode AE1, and the second end EP2 of the first light emitting elements LDa may face the second alignment electrode AE2. The first end EP1 of the second light emitting elements LDb may face the first alignment electrode AE1, and the second end EP2 of the second light emitting elements LDb may face the second alignment electrode AE2.

According to an embodiment, the first to third alignment steps may be repeated according to an alignment degree of the light emitting elements LD. Subsequently, the light emitting elements LD may be stably arranged by evaporating the solvent or removing the solvent in another method.

Subsequently, the display device of FIG. 3 may be completed by forming the connection electrodes CE and the like on the light emitting elements LD. All light emitting elements LD may be biasedly aligned in the first alignment direction by aligning the light emitting elements in the first alignment direction using the alignment electrode AE after biasedly aligning the light emitting elements LD using the auxiliary electrodes SE in the above-described method. For example, the alignment degree of the light emitting elements LD may be improved by precisely controlling a position and a direction of the light emitting elements LD using the alignment electrodes AE and the auxiliary electrodes SE.

Hereinafter, another embodiment is described. In the following embodiment, the same reference numerals refer to the same configurations as those previously described, and a repetitive description is omitted or simplified.

FIGS. 14 to 17 are schematic plan views for each process step of a method of manufacturing a display device according to an embodiment. FIGS. 14 to 17 schematically show a planar structure based on the first alignment electrode AE1, the second alignment electrode AE2, the first auxiliary electrode SE1, and the second auxiliary electrode SE2 of FIG. 4. Hereinafter, substantially the same configurations as those of FIG. 5 are denoted by the same reference numerals, and detailed reference numerals are omitted.

Figure 14:
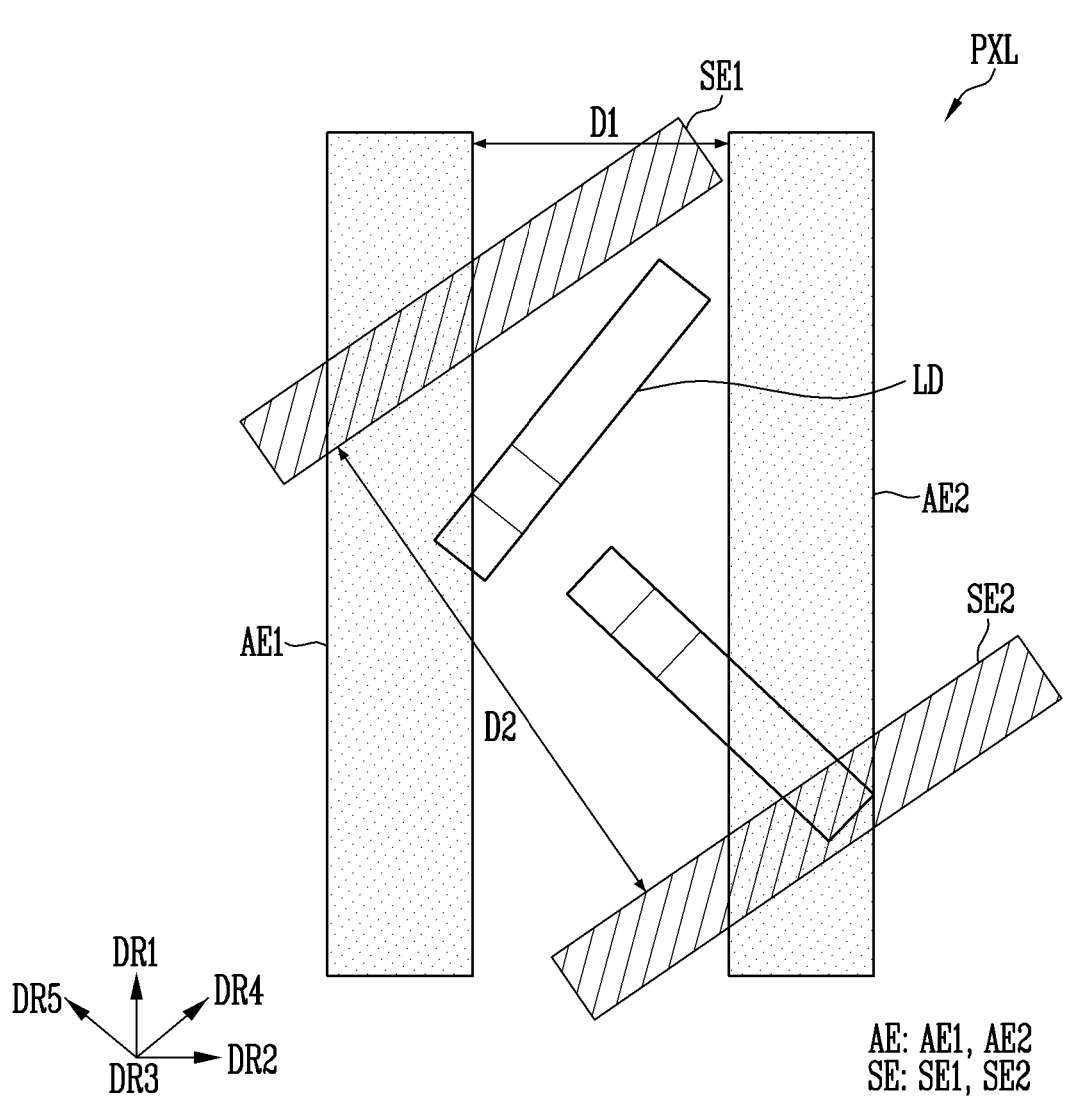

Referring to FIG. 14, first, the alignment electrodes AE1 and AE2 and the auxiliary electrodes SE1 and SE2 may be provided in the pixel PXL. The alignment electrodes AE1 and AE2 may extend in the first direction DR1 and may be spaced apart from each other in the second direction DR2. The auxiliary electrodes SE1 and SE2 may extend in the fourth direction DR4, which is the diagonal direction crossing the first direction DR1 and the second direction DR2, and may be spaced apart from each other in the fifth direction DR5 crossing the fourth direction DR4.

In an embodiment, a distance D1 of the second direction DR2 between the first alignment electrode AE1 and the second alignment electrode AE2 may be less than a distance D2 of the fifth direction DR5 between the first auxiliary electrode SE1 and the second auxiliary electrode SE2, but is not necessarily limited thereto. In an embodiment, the first direction DR1 may be perpendicular to the second direction DR2 and the fourth direction DR4 may be perpendicular to the fifth direction DR5, but the disclosure is not necessarily limited thereto.

Subsequently, the light emitting elements LD may be provided in the pixel PXL. The light emitting elements LD may be prepared in a form dispersed in a light emitting element ink and supplied through an inkjet printing method or the like. For example, the light emitting elements LD may be provided by being dispersed in a volatile solvent.

Figure 15:
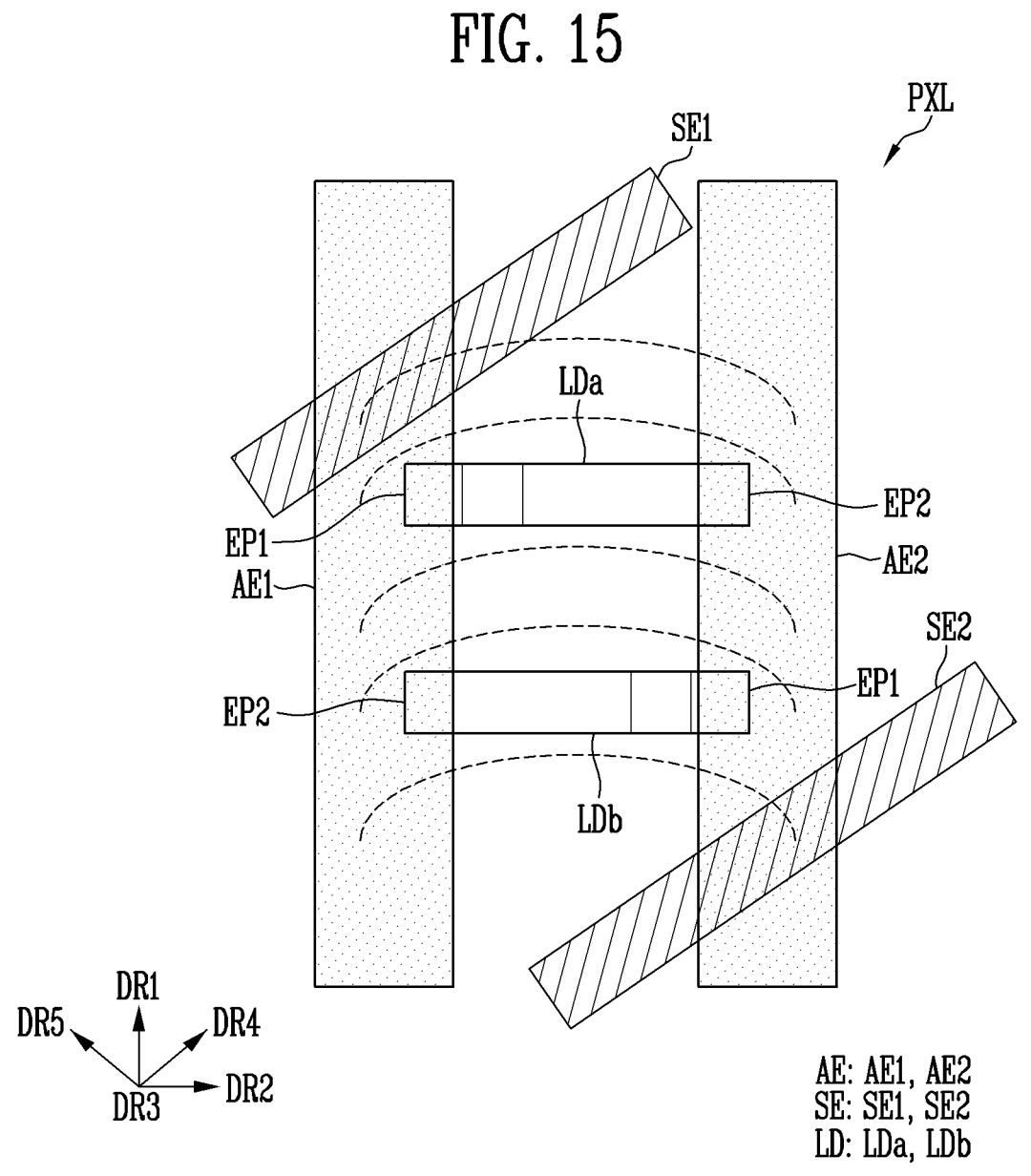

Referring to FIG. 15, subsequently, the light emitting elements LD may be firstly aligned. In case that the alignment signal is applied to the alignment electrodes AE1 and AE2, an electric field may be formed between the alignment electrodes AE1 and AE2, and thus the light emitting elements LD may move to a space between the alignment electrodes AE1 and AE2 and may be aligned.

The light emitting elements LD may be firstly aligned in a first alignment direction between the alignment electrodes AE1 and AE2. In a process in which the light emitting elements LD are firstly aligned, a direction of the first and second ends EP1 and EP2 of the light emitting elements LD may be randomly aligned. For example, the directions of the first and second ends EP1 and EP2 of each of the light emitting elements LD may be different from each other. For example, the first end EP1 of first light emitting elements LDa may face the first alignment electrode AE1, and the second end EP2 of the first light emitting elements LDa may face the second alignment electrode AE2. The first end EP1 of second light emitting elements LDb may face the second alignment electrode AE2, and the second end EP2 of the second light emitting elements LDb may face the first alignment electrode AE1.

Figure 16:
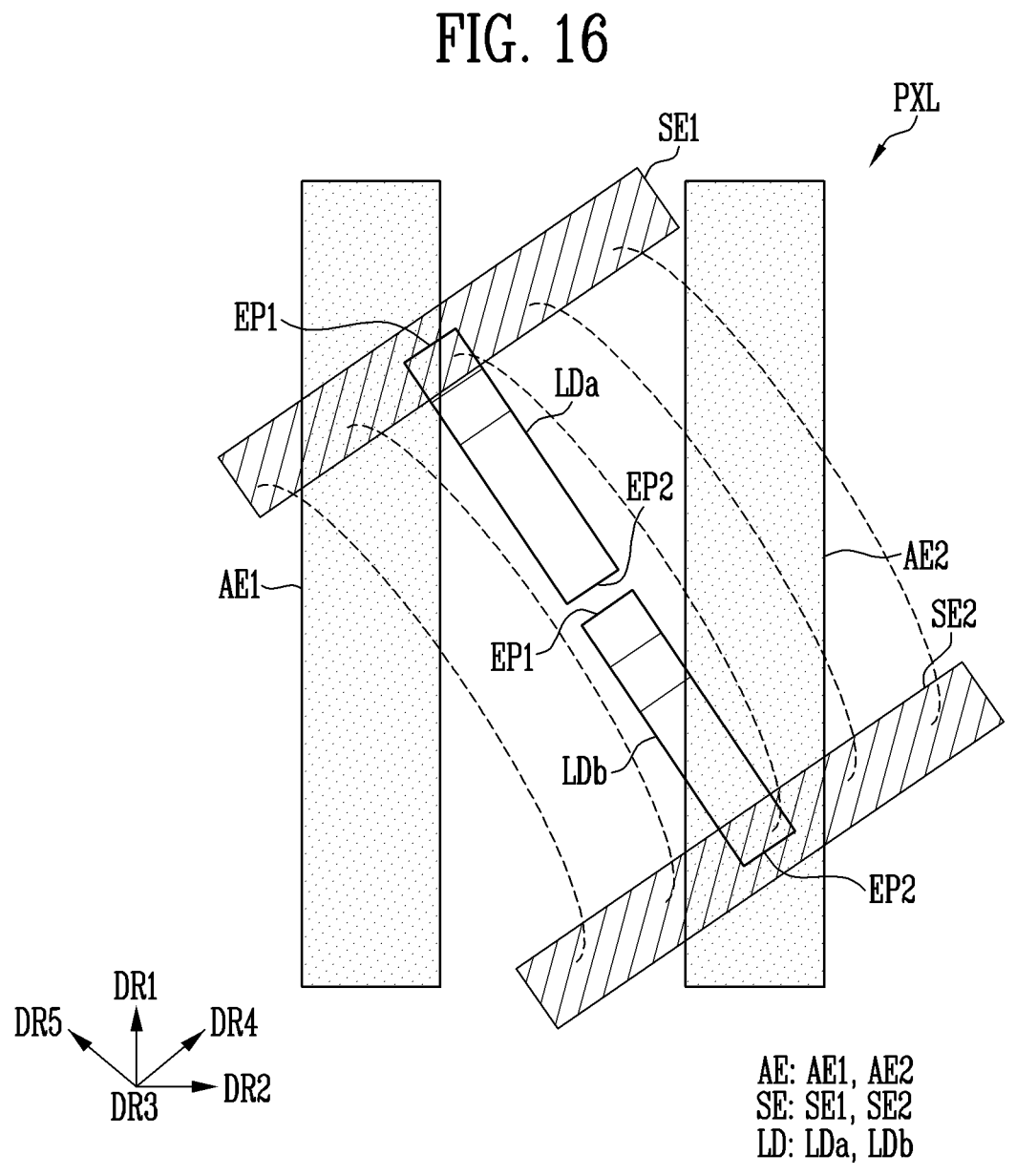

Referring to FIG. 16, subsequently, the light emitting elements LD may be secondly aligned. In case that the auxiliary signal is applied to the auxiliary electrodes SE1 and SE2, an electric field may be formed between the auxiliary electrodes SE1 and SE2, and thus the light emitting elements LD may be biasedly aligned between the auxiliary electrodes SE1 and SE2 by rotational torque. In an embodiment, the light emitting elements LD may be secondly aligned in a second alignment direction between the auxiliary electrodes SE1 and SE2. The second alignment direction may cross the first alignment direction described above. For example, the second alignment direction may be inclined with the first alignment direction. The second alignment direction may be a direction perpendicular to the fourth direction DR4 (or the fifth direction DR5), but is not necessarily limited thereto.

In case that the light emitting elements LD are secondly aligned, the light emitting elements LD may be arranged in the second alignment direction and biasedly aligned. For example, the directions of the first and second ends EP1 and EP2 of each of the light emitting elements LD may be equal to each other. For example, the first end EP1 of the first light emitting elements LDa may face the first auxiliary electrode SE1, and the second end EP2 of the first light emitting elements LDa may face the second auxiliary electrode SE2. The first end EP1 of the second light emitting elements LDb may face the first auxiliary electrode SE1, and the second end EP2 of the second light emitting elements LDb may face the second auxiliary electrode SE2.

Figure 17:
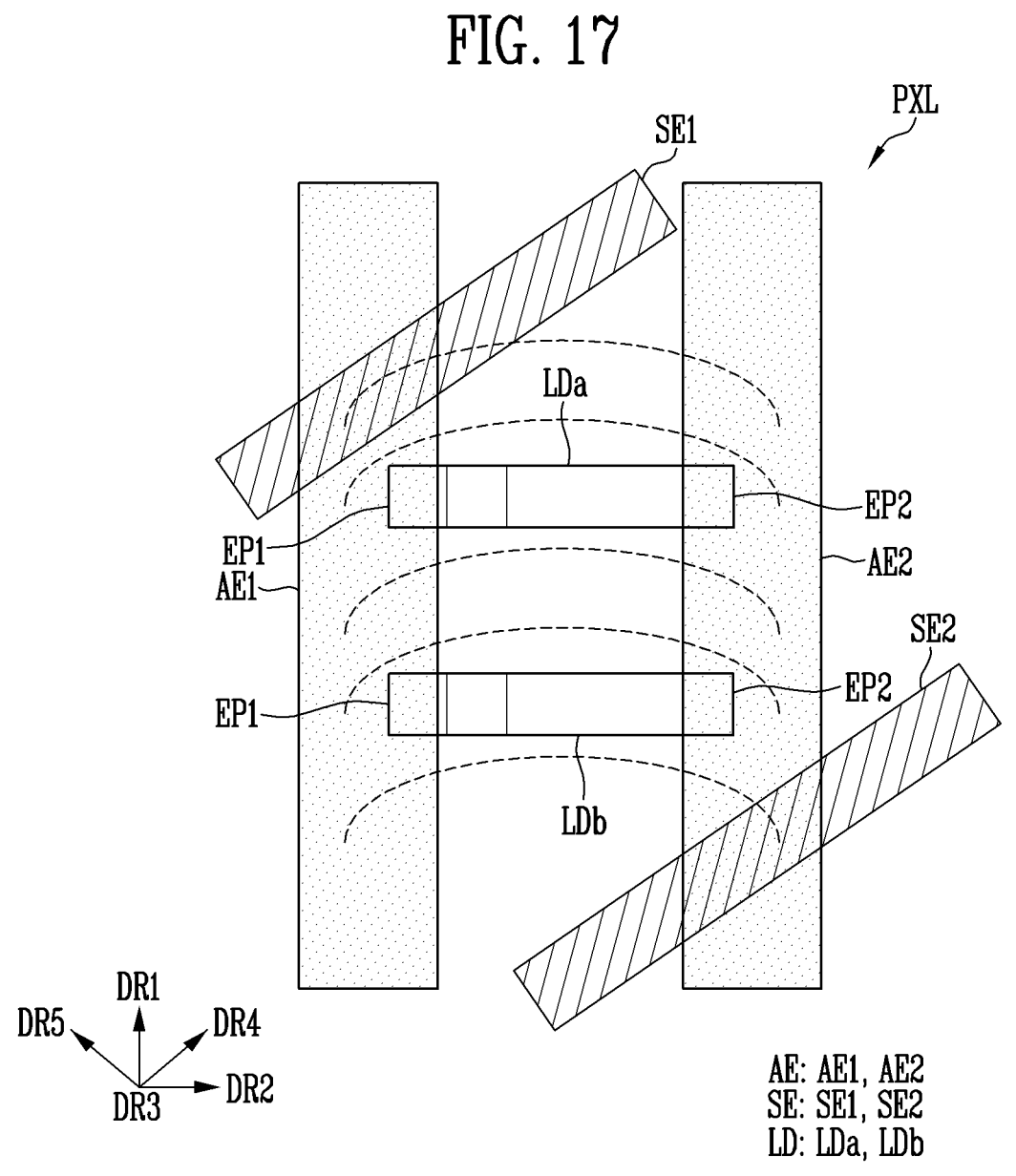

Referring to FIG. 17, subsequently, the light emitting elements LD may be thirdly aligned. In case that the alignment signal is applied to the alignment electrodes AE1 and AE2, an electric field may be formed between the alignment electrodes AE1 and AE2, and thus the light emitting elements LD may be aligned in the first alignment direction between the alignment electrodes AE1 and AE2 in a biasedly aligned state. For example, the directions of the first and second ends EP1 and EP2 of each of the light emitting elements LD may be equal to each other. For example, the first end EP1 of the first light emitting elements LDa may face the first alignment electrode AE1, and the second end EP2 of the first light emitting elements LDa may face the second alignment electrode AE2. The first end EP1 of the second light emitting elements LDb may face the first alignment electrode AE1, and the second end EP2 of the second light emitting elements LDb may face the second alignment electrode AE2.

According to an embodiment, the first to third alignment steps may be repeated according to an alignment degree of the light emitting elements LD. Subsequently, the light emitting elements LD may be stably arranged by evaporating the solvent or removing the solvent in another method. Subsequently, the display device may be completed by forming the connection electrodes CE and the like on the light emitting elements LD. All light emitting elements LD may be biasedly aligned in the first alignment direction by aligning the light emitting elements in the first alignment direction using the alignment electrode AE after biasedly aligning the light emitting elements LD using the auxiliary electrodes SE in the above-described method. For example, the alignment degree of the light emitting elements LD may be improved by precisely controlling the position and the direction of the light emitting elements LD using the alignment electrodes AE and the auxiliary electrodes SE as described above.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure.

What is claimed is:

1. A display device, comprising:

pixels in a display area;

a first alignment electrode and a second alignment electrode that are spaced apart from each other in the pixels and extend in a first direction;

a first auxiliary electrode and a second auxiliary electrode that cross the pixels and extend in a second direction intersecting the first direction; and light-emitting elements that are disposed between the first alignment electrode and the second alignment electrode, wherein the first auxiliary electrode and the second auxiliary electrode are electrically disconnected from the light-emitting elements, wherein a first end of the light-emitting elements faces the first alignment electrode, and wherein a second end of the light-emitting elements faces the second alignment electrode.

2. The display device according to claim 1, further comprising an auxiliary line that extends in the first direction in a non-display area surrounding the display area.

3. The display device according to claim 2, wherein the first auxiliary electrode and the second auxiliary electrode are electrically connected to the auxiliary line.

4. The display device according to claim 1, further comprising an alignment line that extends in the second direction between the pixels.

5. The display device according to claim 4, wherein the first alignment electrode and the second alignment electrode are electrically connected to the alignment line.

6. The display device according to claim 1, wherein the first alignment electrode and the second alignment electrode are alternately arranged in the second direction.

7. The display device according to claim 1, wherein the first auxiliary electrode and the second auxiliary electrode are alternately arranged in the first direction.

8. The display device according to claim 1, wherein a distance between the first alignment electrode and the second alignment electrode is less than a distance between the first auxiliary electrode and the second auxiliary electrode.

9. The display device according to claim 1, further comprising an insulating layer between the first auxiliary electrode and the second auxiliary electrode and between the first alignment electrode and the second alignment electrode.

10. The display device according to claim 1, further comprising connection electrodes disposed on the light-emitting elements.

11. A method of manufacturing a display device, the method comprising:

providing a first alignment electrode and a second alignment electrode that are spaced apart from each other in pixels provided in a display area;

firstly aligning light-emitting elements in a first alignment direction between the first alignment electrode and the second alignment electrode;

providing a first auxiliary electrode and a second auxiliary electrode that extend across the pixels;

secondly aligning the light-emitting elements in a second alignment direction intersecting the first alignment direction between the first auxiliary electrode and the second auxiliary electrode; and thirdly aligning the light-emitting elements in the first alignment direction so that a first end of the light-emitting elements faces the first alignment electrode and a second end of the light-emitting elements faces the second alignment electrode.

12. The method according to claim 11, wherein the first alignment electrode and the second alignment electrode extend in a first direction.

13. The method according to claim 12, wherein the first alignment direction is perpendicular to the first direction.

14. The method according to claim 12, wherein the first auxiliary electrode and the second auxiliary electrode extend in a second direction perpendicular to the first direction.

15. The method according to claim 14, wherein the second direction is perpendicular to the second alignment direction.

16. The method according to claim 12, wherein the first auxiliary electrode and the second auxiliary electrode extend in a second direction inclined with respect to the first direction.

17. The method according to claim 16, wherein the second direction is perpendicular to the second alignment direction.

18. The method according to claim 12, further comprising forming an auxiliary line that extends in the first direction in a non-display area surrounding the display area and is electrically connected to the first auxiliary electrode and the second auxiliary electrode.

19. The method according to claim 11, wherein a distance between the first alignment electrode and the second alignment electrode is less than a distance between the first auxiliary electrode and the second auxiliary electrode.

20. The method according to claim 11, further comprising forming connection electrodes on the thirdly aligned light-emitting elements.

* * * * *